United States Patent
Hummelt et al.

(10) Patent No.: US 10,910,198 B2
(45) Date of Patent: Feb. 2, 2021

(54) SPACECRAFT PROPULSION DEVICES AND SYSTEMS WITH MICROWAVE EXCITATION

(71) Applicant: MOMENTUS INC., Santa Clara, CA (US)

(72) Inventors: Jason Hummelt, Santa Clara, CA (US); Joel Sercel, Santa Clara, CA (US); Philip Mainwaring, Santa Clara, CA (US); James Small, Santa Clara, CA (US); Matthew Parman, Santa Clara, CA (US)

(73) Assignee: MOMENTUS INC., Santa Clara, CA (US)

( * ) Notice: Subject to any disclaimer, the term of this patent is extended or adjusted under 35 U.S.C. 154(b) by 0 days.

(21) Appl. No.: 16/773,908

(22) Filed: Jan. 27, 2020

(65) Prior Publication Data

US 2020/0294772 A1   Sep. 17, 2020

Related U.S. Application Data

(60) Provisional application No. 62/819,350, filed on Mar. 15, 2019, provisional application No. 62/817,190, filed on Mar. 12, 2019.

(51) Int. Cl.
| | |
|---|---|
| *F03H 1/00* | (2006.01) |
| *B64G 1/40* | (2006.01) |
| *H01J 37/32* | (2006.01) |

(52) U.S. Cl.
CPC ........ *H01J 37/32247* (2013.01); *B64G 1/405* (2013.01); *B64G 1/409* (2013.01); *F03H 1/0093* (2013.01)

(58) Field of Classification Search
CPC ........ F03H 1/0093; B64G 1/405; B64G 1/409
See application file for complete search history.

(56) References Cited

U.S. PATENT DOCUMENTS

| | | | |
|---|---|---|---|
| 5,956,938 A | * | 9/1999 | Brandenburg ........ F03H 1/0093 60/203.1 |
| 6,205,769 B1 | | 3/2001 | Brandenburg et al. |

(Continued)

FOREIGN PATENT DOCUMENTS

| | | |
|---|---|---|
| WO | WO-2017085746 A1 | 5/2017 |
| WO | WO-2020/033009 A2 | 2/2020 |

OTHER PUBLICATIONS

International Search Report and Written Opinion for Application No. PCT/US2020/022404, dated Oct. 21, 2020.

(Continued)

*Primary Examiner* — Philip J Bonzell
*Assistant Examiner* — Tye William Abell
(74) *Attorney, Agent, or Firm* — Marshall, Gerstein & Borun LLP

(57) ABSTRACT

A thruster system for use in a spacecraft includes a microwave source, a resonant cavity coupled to the microwave source, wherein the microwave source is configured to generate a standing wave field in the resonant cavity, a nozzle provided at one end of the resonant cavity; and at least one injector configured to inject propellant into the resonant cavity so as to create a rotating circumferential flow. The standing wave field raises a temperature of the injected propellant to provide thrust by way of a hot gas exiting the resonant cavity via the nozzle.

20 Claims, 19 Drawing Sheets

(56) References Cited

U.S. PATENT DOCUMENTS

| | | | | |
|---|---|---|---|---|
| 6,298,659 | B1 * | 10/2001 | Knuth | F02K 9/52 |
| | | | | 60/258 |
| 7,037,484 | B1 * | 5/2006 | Brandenburg | B01J 19/088 |
| | | | | 423/648.1 |
| 7,452,513 | B2 | 11/2008 | Matveev | |
| 2017/0158359 | A1 * | 6/2017 | Fetta | F03H 99/00 |
| 2018/0327118 | A1 * | 11/2018 | Ganapathy | B64G 1/405 |

OTHER PUBLICATIONS

Micci, "Low-Power Solid-State Microwave Thruster Systems," Spacecraft Propulson, Third International Conference (2000).
Partial International Search Report for Application No. PCT/US2020/022404, dated Aug. 26, 2020.
Sullivan et al., "Development of a Microwave Resonant Cavity Electrothermal Thruster Prototype," 23rd International Electric Propulsion Conference (1993).
Sullivan et al., "Performance Testing and Exhaust Plume Characterization of the Microwave Arcjet Thruster," 30th Joint Propulson Conference and Exhibit (1994).

* cited by examiner

SPACECRAFT PROPULSION DEVICES AND SYSTEMS WITH MICROWAVE EXCITATION

CROSS-REFERENCE TO RELATED APPLICATIONS

The present application is a non-provisional application claiming priority to U.S. Provisional Patent Application No. 62/819,350, filed on Mar. 15, 2019 and titled "Rotating Rocket"; and U.S. Provisional Patent Application No. 62/817,190, filed on Mar. 12, 2019 and titled "System and Method for Improved Gas Injection in Electric Spacecraft Rockets."

FIELD OF THE DISCLOSURE

The disclosure generally relates to operating a spacecraft and more specifically to improving efficiency and reliability of thrusters.

BACKGROUND

This background description is provided for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With increased commercial and government activity in the near space, a variety of spacecraft and missions are under development. Multiple propulsion techniques are known, and today the spacecraft can implement several types of thrusters.

One such type is microwave electrothermal thruster (METs), based on a method of electrical propulsion that uses a microwave power source to generate and heat a plasma contained within a resonant chamber or resonant cavity. Generally speaking, the microwave energy is provided to the chamber by means of a probe (sometimes referred to as an "antenna") or a waveguide. This microwave energy raises the temperature of a gaseous propellant and provides thrust in the form of hot gases exiting the chamber through a nozzle.

Existing forms of microwave electrothermal thrusters have been tested in research universities. These prototypes reveal multiple inefficiencies such as those related to the transfer of microwave power to the resonant cavity, the loss of thermal energy to the nozzle of the system, issues with low-power efficiency, etc.

Further, MET thrusters generally are not expected to provide the same amount of thrust as chemical propulsion thrusters which utilize a reduction-oxidation reaction to generate a hot gas that exits via a nozzle and generates thrust.

SUMMARY

Generally speaking, the techniques of this disclosure improve the efficiency and reliability of a thruster system operating in a spacecraft. The thruster system can include one or more thrusters. The one or more thrusters can operate as MET thrusters and, in some cases, also operate as chemical propulsion thrusters in a certain operational mode. In some cases, the thruster system includes multiple sources of microwave power (e.g., magnetrons) to provide redundancy and/or provide combined microwave power.

Further, some of the techniques of this disclosure increase the efficiency of converting propellant into thrust inside a resonant cavity of a MET thruster. As discussed below, these techniques can generate a rotating circumferential flow of hot gas within the resonant cavity to thereby improve the efficiency of expelling the hot gas via the nozzle and increase the amount of thrust. As further discussed below, these techniques can involve modifications to the shape of the resonant cavity, using annular inserts that extend into the cavity, or both.

Still further, some of these techniques allow the throat of a nozzle to be coated with materials that protect the nozzle from oxidation. In various implementations, the coating is implemented when the thruster is manufactured, when the thruster operates in a spacecraft deployed in space in a certain operational mode different from the "regular" thrusting mode, or when the thruster operates in a spacecraft deployed in space in the regular thrusting mode.

Another technique of this disclosure allows the thruster to automatically tune the resonant frequency of the resonant cavity, when the resonant frequencies of the resonant cavity shift due to the presence of plasma in the resonant cavity.

One example embodiment of these techniques is a thruster system for use in a spacecraft. The thruster system includes a microwave source; a resonant cavity coupled to the microwave source, such that the microwave source is configured to generate a standing wave field in the resonant cavity; a nozzle provided at one end of the resonant cavity; and at least one injector configured to inject propellant into the resonant cavity so as to create a rotating circumferential flow. The standing wave field raises a temperature of the injected propellant to provide thrust by way of a hot gas exiting the resonant cavity via the nozzle.

Another example embodiment of these techniques is a method in a spacecraft for operating a thruster that includes a microwave source, a resonant cavity, and a source of propellant which the thruster uses to generate thrust. The method includes injecting a propellant into the resonant cavity, including imparting angular momentum to the injected propellant; and causing the microwave source to generate a standing wave within the resonant cavity to raise a temperature of the injected propellant and provide thrust by way of a hot gas exiting the resonant cavity via the nozzle, where the angular momentum imparted to the injected propellant produces a rotating circumferential flow of the hot gas within the resonant cavity.

Another example embodiment of these techniques is a method in a spacecraft for operating a thruster that includes a microwave source, a resonant cavity, and a source of propellant which the thruster converts to hot gas and directs via a nozzle to generate thrust. The method includes operating the thruster in an ignition mode in which the microwave source outputs power at a first rate; and operating the thruster in a propulsion mode in which the microwave source outputs power at a second rate higher than the first rate.

Another example embodiment of these techniques is a method in a spacecraft for operating a thruster that includes a microwave source, a resonant cavity, and a source of propellant which the thruster uses to generate thrust. The method includes injecting the propellant into the resonant cavity at a first flow rate; causing the microwave source to generate power for application to the injected propellant resonant cavity until at least a portion of the propellant is ionized, at a second time subsequent to the first time; and injecting the propellant into the resonant cavity at a second flow rate higher than the first flow rate, subsequently to the second time.

Another example embodiment of these techniques is a thruster system including a microwave source; a resonant cavity coupled to the microwave source, wherein the microwave source is configured to generate a standing wave field in the resonant cavity; a nozzle provided at one end of the resonant cavity; at least one injector configured to inject propellant into the resonant cavity; and a controller configured to operate the thruster system according to the method above.

Another example embodiment of these techniques is a thruster including a cavity in which a propellant is heated to generate hot gas; a top plate disposed at one end of the cavity, the top plate made of a first material having a first coefficient of thermal expansion $\alpha_1$; a nozzle embedded in the top plate, the nozzle made of a second material having a second coefficient of thermal expansion $\alpha_2$ different from $\alpha_1$; and an insert disposed between the nozzle and the top plate, the insert made of a third material selected so as to reduce stress on the nozzle due to a difference in thermal expansion of the nozzle and the top plate when the hot gas exits the cavity via the nozzle to generate thrust.

Another example embodiment of these techniques is a thruster system for use in a spacecraft. The thruster system includes a microwave source; a resonant cavity coupled to the microwave source, where the microwave source is configured to generate a standing wave field in the resonant cavity; an injector configured to inject propellant into the resonant cavity; a nozzle provided at one end of the resonant cavity; and an annular structure extending into the resonant cavity, the annular structure configured to reduce a radius of the resonant cavity near the nozzle to improve vorticity of a hot gas exiting the resonant cavity via the nozzle.

Another example embodiment of these techniques is a thruster including a cavity in which a hot gas is generated using a propellant; an injector configured to deliver the propellant into the cavity; a top plate disposed at one end of the cavity; and an adapter configured to receive a nozzle and removeably attach to the top plate; where the hot gas exits cavity via the nozzle to generate thrust.

Another example embodiment of these techniques is a thruster system for use in a spacecraft. The thruster includes a microwave source; a cylindrical resonant cavity with a diameter that varies along a direction of the thrust, for at least a portion of a height of the resonant cavity, the resonant cavity coupled to the microwave source which generates a standing wave field in the resonant cavity; a nozzle provided at one end of the resonant cavity; and at least one injector configured to inject propellant into the resonant cavity. The standing wave field raises a temperature of the injected propellant to provide thrust by way of a hot gas exiting the resonant cavity via the nozzle.

Another example embodiment of these techniques is a method for operating a microwave electrothermal thruster (MET) system of a spacecraft. The method includes causing multiple microwave generators to generate respective signals; combining power of at least several of the generated signals, including adjusting a phase of each of the generated signals, and directing the phase-shifted signals to a switching network. The method further includes providing an output of the switching network to at least one resonant cavity of a respective MET thruster.

Another example embodiment of these techniques is a redundant MET system of a spacecraft. The system includes multiple microwave generators to generate respective signals; and a switching network configured to receive the signals and direct at least a subset of these signals to one or more MET thrusters of the spacecraft.

Another example embodiment of these techniques is a method of manufacturing a thruster of a spacecraft, the thruster including a cavity and a nozzle. The method includes operating the thruster in a first operational mode prior to deployment of the thruster in space, including injecting a coating mix including at least one coating material into the cavity, and causing a first hot gas including the coating mix to exit the cavity via the nozzle, thereby coating a throat of the nozzle with the coating material. The thruster, when operating in space in a second operational mode, receives a propellant to generate a second hot gas and produces thrust by expelling the second hot gas via the nozzle.

Another example embodiment of these techniques is a method of operating a thruster of a spacecraft, the thruster including a cavity and a nozzle. The method includes operating the thruster in a first operational mode, including injecting a coating mix including at least one coating material into the cavity, and causing a first hot gas including the coating mix to exit the cavity via the nozzle, thereby coating a throat of the nozzle with the coating material. The method also includes operating the thruster in a second operational mode, including injecting a propellant to generate a second hot gas to produce thrust by expelling the second hot gas via the nozzle.

Another example embodiment of these techniques is a thruster system for use in a spacecraft. The thruster system includes a microwave source; a cylindrical housing of a resonant cavity; a waveguide to couple the microwave source to the resonant cavity, the waveguide shaped so as to abut the cylindrical housing along at least a portion of a circumference of the cylindrical housing, to increase coupling efficiency.

Another example embodiment of these techniques is a thruster system for use in a spacecraft. The thruster includes a microwave source configured to generate an electromagnetic signal; a resonant cavity coupled to the microwave source, where the microwave source is configured to generate a standing wave field in the resonant cavity; a ferrite insert disposed within the resonant cavity; and a magnet disposed outside the resonant cavity and configured to exert a magnetic bias field on the ferrite insert to thereby modify electromagnetic properties of the ferrite insert and tune the resonant frequency of the resonant cavity.

Another example embodiment of these techniques is a method in a spacecraft for operating a thruster that includes a microwave source, a resonant cavity, and a source of propellant which the thruster converts to hot gas and directs via a nozzle to generate thrust. The method includes operating the thruster in an ignition mode in which the propellant is not ionized; and operating the thruster in a propulsion mode in which at least a portion of the propellant is ionized to generate plasma, including automatically tuning the resonant cavity to counteract an impact of the generated plasma on resonant frequencies of the resonant cavity.

Another example embodiment of these techniques is a thruster including a cavity in which a propellant is heated to generate hot gas; a top plate disposed at one end of the cavity; a nozzle embedded in the top plate; and a nozzle insert made of a refractory metal and configured to fit inside a throat of the nozzle to reduce oxidation of the nozzle.

Another example embodiment of these techniques is a method of operating a thruster of a spacecraft, the thruster including a cavity and a nozzle. The method includes providing a propellant to the cavity via a propellant supply line; injecting a coating mix including at least one coating material into the propellant supply line, so that a mixture of the propellant and the coating mix is injected into the cavity; and operating the thruster to generate a hot gas inside the cavity and produce thrust by expelling the hot gas from the cavity via the nozzle, including causing the hot gas to coat a throat of the nozzle with the coating material to protect the nozzle from oxidation.

Another example embodiment of these techniques is a multi-mode thruster system for use in a spacecraft. The system includes a microwave source; a cavity coupled to the microwave source and including a first inlet to receive a first fluid and a second inlet to receive a second fluid; and a nozzle provided at one end of the cavity. The thruster operates in a MET mode to (i) generate a standing wave in the cavity using the microwave source and (ii) raise a temperature of the first fluid to generate a first hot gas that exits the cavity via the nozzle to generate thrust. The thruster operates in a chemical propulsion mode to (i) produce a reduction-oxidation reaction between the first fluid and the second fluid and (ii) generate a second hot gas that exits the cavity via the nozzle to generate thrust.

Another example embodiment of these techniques is a thruster system for use in a spacecraft. The thruster system includes a microwave source configured to generate microwave energy; a waveguide coupled the microwave source; a propellant compartment fluidicly coupled to a propellant supply line to receive a propellant; and a nozzle disposed at one end of the propellant compartment. The propellant compartment is disposed through the wave guide, so that the waveguide delivers the microwave energy to the propellant within the propellant compartment to heat up the propellant and generate thrust in a form of hot gas existing the propellant compartment via the nozzle.

Another example embodiment of these techniques is a thruster system for use in a spacecraft. The thruster system includes a microwave source configured to generate microwave energy; a coaxial transmission line coupled the microwave source; a propellant compartment disposed within the coaxial transmission line; and a nozzle disposed at one end of the coaxial transmission line. The waveguide delivers the microwave energy to the propellant within the propellant compartment to heat up the propellant and generate thrust in a form of hot gas existing the propellant compartment via the nozzle.

DETAILED DESCRIPTION

A spacecraft of this disclosure may be configured for transferring a payload from a lower energy orbit to a higher energy orbit according to a set of mission parameters. The mission parameters may include, for example, a time to complete the transfer and an amount of propellant and/or fuel available for the mission. Generally, the spacecraft may collect solar energy and use the energy to power one or more thrusters. Different thruster types and/or operating modes may trade off the total amount of thrust with the efficiency of thrust with respect to fuel or propellant consumption, defined as a specific impulse.

In the inner solar system, ample and continuous electric power is available through solar cell collectors on spacecraft. There may be an efficiency advantage to using solar-electric power for spacecraft propulsion. Also, electric heating of propellant gasses may eliminate the need for caustic or dangerously explosive bi-propellant fuels. Simple lightweight molecules may serve as high specific-impulse propellants. These include: hydrogen, water, ammonia, carbon dioxide, and cryogenic liquids such as liquid helium or argon.

In spacecraft propulsion systems, efficient use of propellant may enable better mission parameters (e.g., faster or more payload). In general, chemical systems deliver the highest thrust but have the lowest propellant efficiency, as measured by specific impulse. Once a spacecraft is free of atmospheric drag, it is often desirable to use a low-thrust high specific-impulse electric thrusters rather than lower specific-impulse chemical thrusters. While mission times may be longer with low thrust propulsion, the total mission range can be substantially extended by using high specific impulse systems. In electro thermal propulsion, electric power is used to directly heat propellant gasses to higher temperatures than can be reached with chemical systems, thereby improving specific impulse.

The spacecraft in some implementations includes thrusters of different types to improve the efficiency of using solar energy when increasing orbital energy. In some implementations, the spacecraft uses the same subsystems for operating the different-type thrusters, thereby reducing the mass and/or complexity of the spacecraft, and thus decreasing mission time while maintaining and/or improving reliability. Additionally or alternatively, the spacecraft can choose or alternate between thrusters of different types as primary thrusters. The spacecraft can optimize these choices for various mission goals (e.g., different payloads, different destination orbits) and/or mission constraints (e.g., propellant availability). Example optimization of these choices can include variations in collecting and storing solar energy as well as in controlling when the different thrusters use the energy and/or propellant, as discussed below.

Figure 1:
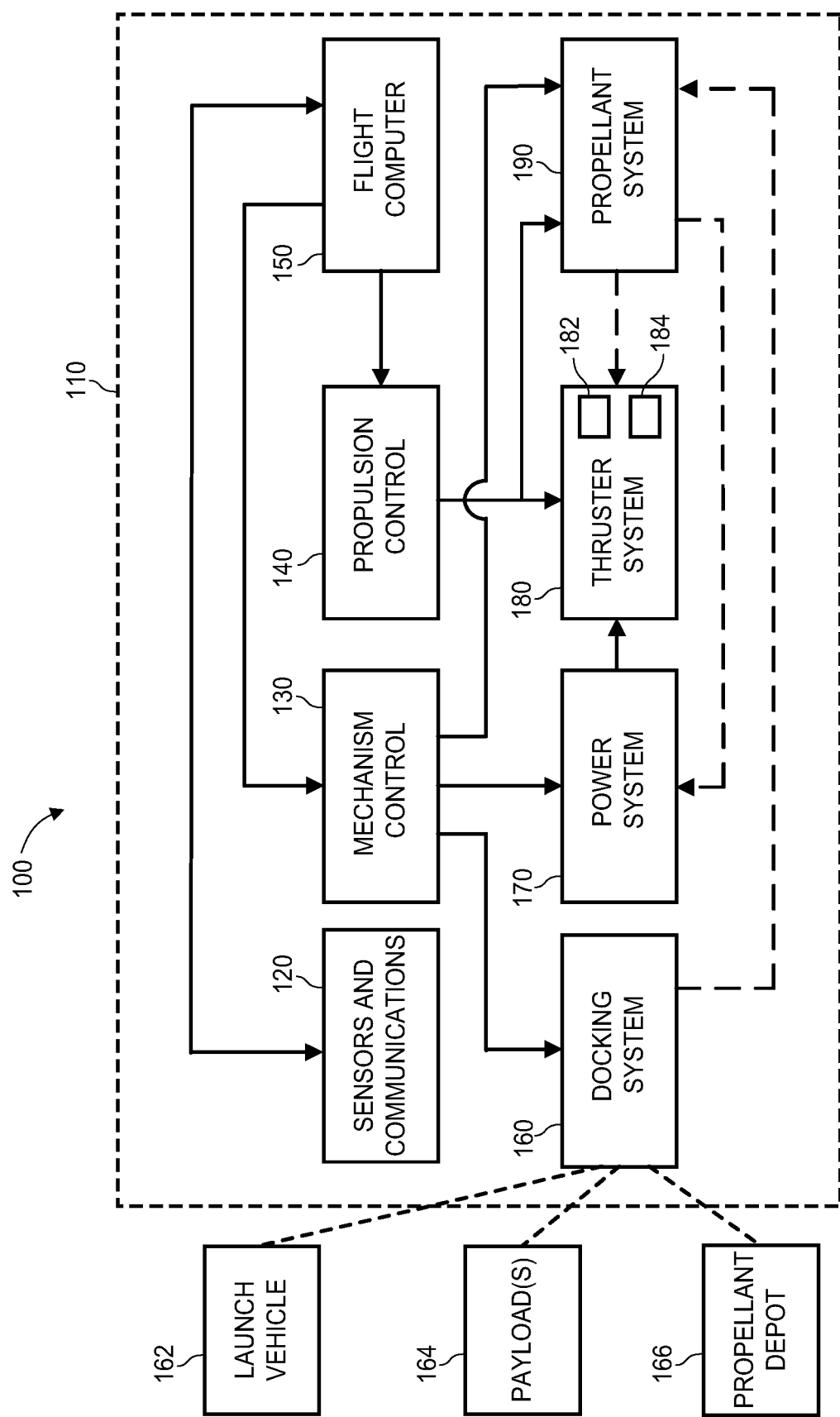
FIG. 1 is a block diagram of an example spacecraft in which the techniques of this disclosure can be implemented.

FIG. 1 is a block diagram of a spacecraft 100 configured for transferring a payload between orbits. The spacecraft 100 includes several subsystems, units, or components disposed in or at a housing 110. The subsystems of the spacecraft 100 may include sensors and communications components 120, mechanism control 130, propulsion control 140, a flight computer 150, a docking system 160 (for attaching to a launch vehicle 162, one or more payloads 164, a propellant depot 166, etc.), a power system 170, a thruster system 180 that includes a first thruster 182 and a second thruster 184, and a propellant system 190. Furthermore, any combination of subsystems, units, or components of the spacecraft 100 involved in determining, generating, and/or supporting spacecraft propulsion (e.g., the mechanism control 130, the propulsion control 140, the flight computer 150, the power system 170, the thruster system 180, and the propellant system 190) may be collectively referred to as a propulsion system of the spacecraft 100.

The sensors and communications components 120 may several sensors and/or sensor systems for navigation (e.g., imaging sensors, magnetometers, inertial motion units (IMUs), Global Positioning System (GPS) receivers, etc.), temperature, pressure, strain, radiation, and other environmental sensors, as well as radio and/or optical communication devices to communicate, for example, with a ground station, and/or other spacecraft. The sensors and communications components 120 may be communicatively connected with the flight computer 150, for example, to provide the flight computer 150 with signals indicative of information about spacecraft position and/or commands received from a ground station.

The flight computer 150 may include one or more processors, a memory unit, computer readable media, to process signals received from the sensors and communications components 120 and determine appropriate actions according to instructions loaded into the memory unit (e.g., from the computer readable media). Generally, the flight computer 150 may be implemented any suitable combination of processing hardware, that may include, for example, applications specific integrated circuits (ASICs) or field programmable gate arrays (FPGAs), and/or software components. The flight computer 150 may generate control messages based on the determined actions and communicate the control messages to the mechanism control 130 and/or the propulsion control 140. For example, upon receiving signals indicative of a position of the spacecraft 100, the flight computer 150 may generate a control message to activate one of the thrusters 182, 184 in the thruster system 180 and send the message to the propulsion control 140. The flight computer 150 may also generate messages to activate and direct sensors and communications components 120.

The docking system 160 may include a number of structures and mechanisms to attach the spacecraft 100 to a launch vehicle 162, one or more payloads 164, and/or a propellant refueling depot 166. The docking system 160 may be fluidicly connected to the propellant system 190 to enable refilling the propellant from the propellant depot 166. Additionally or alternatively, in some implementations at least a portion of the propellant may be disposed on the launch vehicle 162 and outside of the spacecraft 100 during launch. The fluidic connection between the docking system 160 and the propellant system 190 may enable transferring the propellant from the launch vehicle 162 to the spacecraft 100 upon delivering and prior to deploying the spacecraft 100 in orbit.

The power system 170 may include components (discussed in the context of FIGS. 4-7) for collecting solar energy, generating electricity and/or heat, storing electricity and/or heat, and delivering electricity and/or heat to the thruster system 180. To collect solar energy into the power system 170, solar panels with photovoltaic cells, solar collectors or concentrators with mirrors and/or lenses, or a suitable combination of devices may collect solar energy. In the case of using photovoltaic devices, the power system 170 may convert the solar energy into electricity and store it in energy storage devices (e.g, lithium ion batteries, fuel cells, etc.) for later delivery to the thruster system 180 and other spacecraft components. In some implementations, the power system 180 may deliver at least a portion of the generated electricity directly to the thruster system 180 and/or to other spacecraft components. When using a solar concentrator, the power system 170 may direct the concentrated (having increased irradiance) solar radiation to photovoltaic solar cells to convert to electricity. In other implementations, the power system 170 may direct the concentrated solar energy to a solar thermal receiver or simply, a thermal receiver, that may absorb the solar radiation to generate heat. The power system 170 may use the generated heat to power a thruster directly, as discussed in more detail below, to generate electricity using, for example, a turbine or another suitable technique (e.g., a Stirling engine). The power system 170 then may use the electricity directly for generating thrust or store electric energy as briefly described above, or in more detail below.

The thruster system 180 may include a number of thrusters and other components configured to generate propulsion or thrust for the spacecraft 100. Thrusters may generally include main thrusters that are configured to substantially change speed of the spacecraft 100, or as attitude control thrusters that are configured to change direction or orientation of the spacecraft 100 without substantial changes in speed. In some implementations, the first thruster 182 and the second thruster 184 may both be configured as main thrusters, with additional thrusters configured for attitude control. The first thruster 182 may operate according to a first propulsion technique, while the second thruster 184 may operate according to a second propulsion technique.

For example, the first thruster 182 may be a microwave-electro-thermal (MET) thruster. In a MET thruster cavity, an injected amount of propellant may absorb energy from a microwave source (that may include one or more oscillators) included in the thruster system 180 and, upon partial ionization, further heat up, expand, and exit the MET thruster cavity through a nozzle, generating thrust.

The second thruster 184 may be a solar thermal thruster. In one implementation, propellant in a thruster cavity acts as the solar thermal receiver and, upon absorbing concentrated solar energy, heats up, expands, and exits the nozzle generating thrust. In other implementations, the propellant may absorb heat before entering the cavity either as a part of the thermal target or in a heat exchange with the thermal target or another suitable thermal mass thermally connected to the thermal target. In some implementations, while the propellant may absorb heat before entering the thruster cavity, the thruster system 180 may add more heat to the propellant within the cavity using an electrical heater or directing a portion of solar radiation energy to the cavity.

The propellant system 190 may store the propellant for use in the thruster system 180. The propellant may include water, hydrogen peroxide, hydrazine, ammonia or another suitable substance. The propellant may be stored on the spacecraft in solid, liquid, and/or gas phase. To that end, the propellant system 190 may include one or more tanks. To move the propellant within the spacecraft 100, and to deliver the propellant to one of the thrusters, the propellant system may include one or more pumps, valves, and pipes. As described below, the propellant may also store heat and/or facilitate generating electricity from heat, and the propellant system 190 may be configured, accordingly, to supply propellant to the power system 170.

The mechanism control 130 may activate and control mechanisms in the docking system 160 (e.g., for attaching and detaching payload or connecting with an external propellant source), the power system 170 (e.g., for deploying and aligning solar panels or solar concentrators), and/or the propellant system (e.g., for changing configuration of one or more deployable propellant tanks). Furthermore, the mechanism control 130 may coordinate interaction between subsystems, for example, by deploying a tank in the propellant system 190 to receive propellant from an external source connected to the docking system 160.

The propulsion control 140 may coordinate the interaction between the thruster system 140 and the propellant system 190, for example, by activating and controlling electrical components (e.g., a microwave source) of the thruster system 140 and the flow of propellant supplied to thrusters by the propellant system 190. Additionally or alternatively, the propulsion control 140 may direct the propellant through elements of the power system 170. For example, the propellant system 190 may direct the propellant to absorb the heat (e.g., at a heat exchanger) accumulated within the power system 170. Vaporized propellant may then drive a power plant (e.g., a turbine, a Stirling engine, etc.) of the power system 170 to generate electricity. Additionally or alternatively, the propellant system 190 may direct some of the propellant to charge a fuel cell within the power system 190.

The subsystems of the spacecraft may be merged or subdivided in different implementations. For example, a single control unit may control mechanisms and propulsion. Alternatively, dedicated controllers may be used for different mechanisms (e.g., a pivot system for a solar concentrator), thrusters (e.g., a MET thruster), valves, etc. In the following discussion, a controller may refer to any portion or combination of the mechanism control 130 and/or propulsion control 140.

Figure 2:
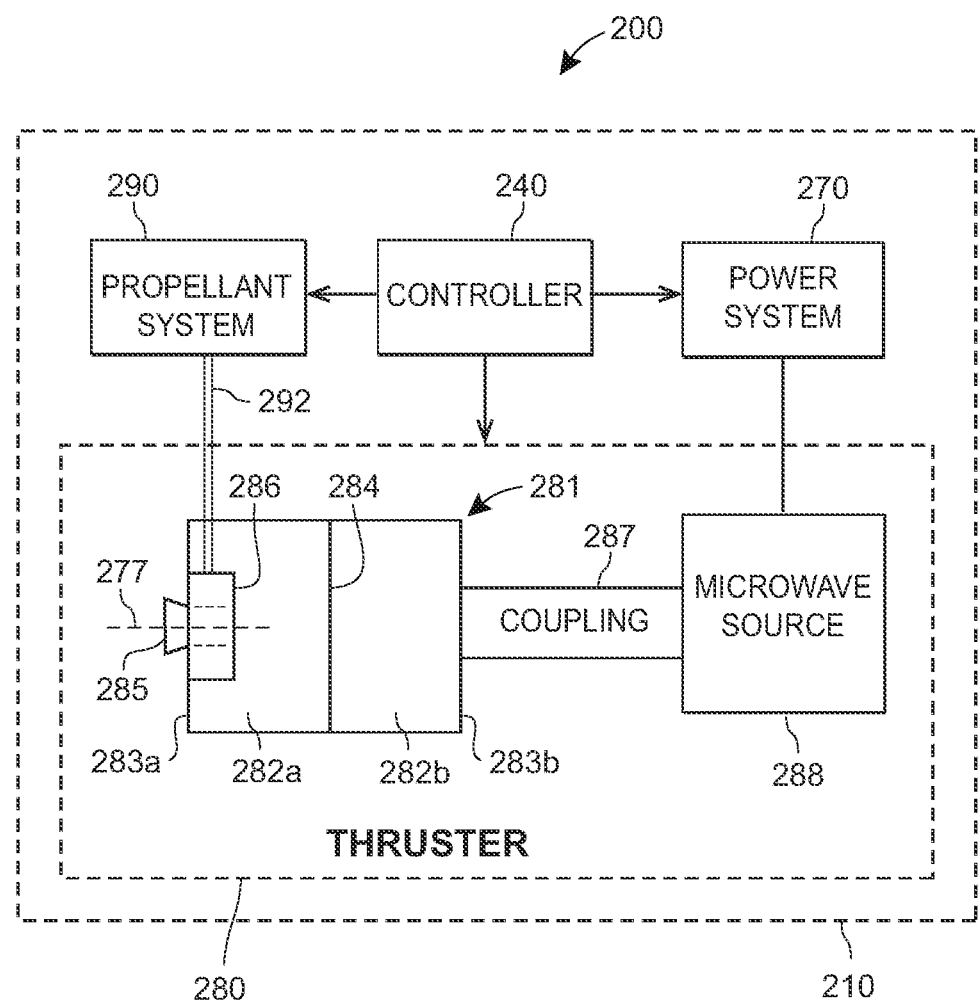
FIG. 2 illustrates an example thruster system that can operate in the spacecraft of FIG. 1.

FIG. 2 illustrates a MET thruster system 280 operating within a spacecraft system 210 that also includes a controller 240, a power system 270, and a propellant system 290. The MET thruster system 280 includes a resonant cavity 281 with a thrust axis 277, separated into a propellant compartment 282a and a microwave coupling compartment 282b. The resonant cavity 281 also can be referred to as a chamber (e.g., propulsion chamber, resonant chamber, etc.) or a resonator. Relative to a nominal orientation of the thruster 281, the propellant compartment 282a may be referred to as an upper cavity, and the microwave coupling compartment 282b may be referred to as a lower cavity. The resonant cavity 281 extends between a top plate 283a and a bottom plate 283b, and is separated into the two compartments 282a,b by a dielectric window 284. A nozzle 285 may be disposed trough the top plate 283a, with the top plate 283a substantially surrounding the nozzle 285. A propellant injection structure 286 may be disposed at the top plate 283a (e.g., included into an annular structure that extends into the cavity 281) or at another suitable location in the propellant compartment 282a. The propellant injection structure 286 may be fluidicly coupled to the propellant system 290 via a supply line 292. The injection structure 286 may include one or more injectors configured to inject propellant into the propellant compartment 282a of the resonant cavity 281 so as to create a rotating circumferential flow.

The resonant cavity may be made of metal or another suitable material. In some implementations, the resonant cavity may be made of a ceramic material with a metal coating in order to improve thermal and conductive properties.

The microwave coupling compartment 282b of the resonant cavity 281 may electromagnetically couple via a coupling structure 287 to a microwave source 288. In some implementations, the coupling structure 287 couples energy into the cavity 281 via an evanescent electromagnetic field. The microwave source may include one or more microwave generators or oscillators (e.g., magnetrons, solid-state Colpitts circuits, etc.), amplifiers, phase controllers, switches, and/or other suitable microwave circuits and devices. Combining multiple oscillators in a microwave source 288 is discussed in reference to FIGS. 3A and 3B. The microwave coupling structure 287 may include a coaxial cable terminated with a probe or an antenna, or a waveguide terminated with one or more apertures to couple electromagnetic energy generated by the microwave source 288 to a mode (or multiple modes) of the resonant cavity 281. Furthermore, the coupling structure may include impedance matching or tuning elements (e.g., stubs, quarter-wave transformers, etc.). Example coupling structures are discussed with reference to FIGS. 6A,B and 7A,B. By way of the coupling structure 287, the microwave source 288 generates standing waves with spatial power distribution defined by the excited modes in the resonant cavity 281.

In operation of the thruster system 280, the power delivered to the mode(s) of the resonant cavity 281 may ionize a portion of the injected propellant, creating plasma that subsequently absorbs more electromagnetic energy. The energy absorbed by the plasma heats the surrounding propellant that increases in temperature and pressure and escapes the propellant compartment 282a through the nozzle 285 to generate thrust. Substantially confining the plasma to a suitable region near an inlet of the nozzle 285 increases efficiency of the thruster system 280. One way of confining the plasma is to introduce rotating circumferential flow of the injected propellant, as briefly discussed above and, in more details with reference to FIGS. 8A, 8B.

Alternative implementations of the thruster system 210 may not include a resonant cavity 281 (e.g., as discussed with reference to FIG. 4) or may integrate the resonant cavity into the coupling structure 287 (e.g., as discussed with reference to FIG. 5).

In some implementations, the thruster system 280 may be implemented at least in part on a circuit board, with integrated and discrete components. Solid-state oscillators may be used to implement the microwave source 288. Microstrip and coplanar or other suitable transmission lines may implement the coupling 287, and at least a portion of the propellant cavity 281 may be etched through the circuit board.

Further, in some implementations, additional components may surround the portion of the nozzle 285 outside the resonant cavity 281. The components may be configured for further heating the gas exiting the nozzle 285 and/or for directing the flow of the exiting gas by static or electric or magnetic field. In this manner, the thruster can improve specific thrust $I_{SP}$.

In some implementations, the MET thruster system 280 can be configured to operate in a MET mode as well as a chemical propulsion mode. When operating in the chemical propulsion mode, the MET thruster system 280 can generate thrust by forming a hot gas in the cavity 281 using a reduction-oxidation reaction between a first fluid (e.g., hydrozene) and a second fluid (e.g., hydrogen peroxide). The first and second fluids can operate as reducing and oxidizing agents, respectively. Moreover, the same fluid (e.g., hydrozene) can function as the propellant in the MET mode of operation as well as one of the agents in the chemical mode of operation. Still further, the MET thruster system 280 in some implementations can employ fuel cells that store oxygen and hydrogen separately, and thus the same fluid, water, can be used as a propellant ion the MET mode of operation and as a source of the reducing and oxidizing agents in the chemical mode of operation.

Figure 3A:
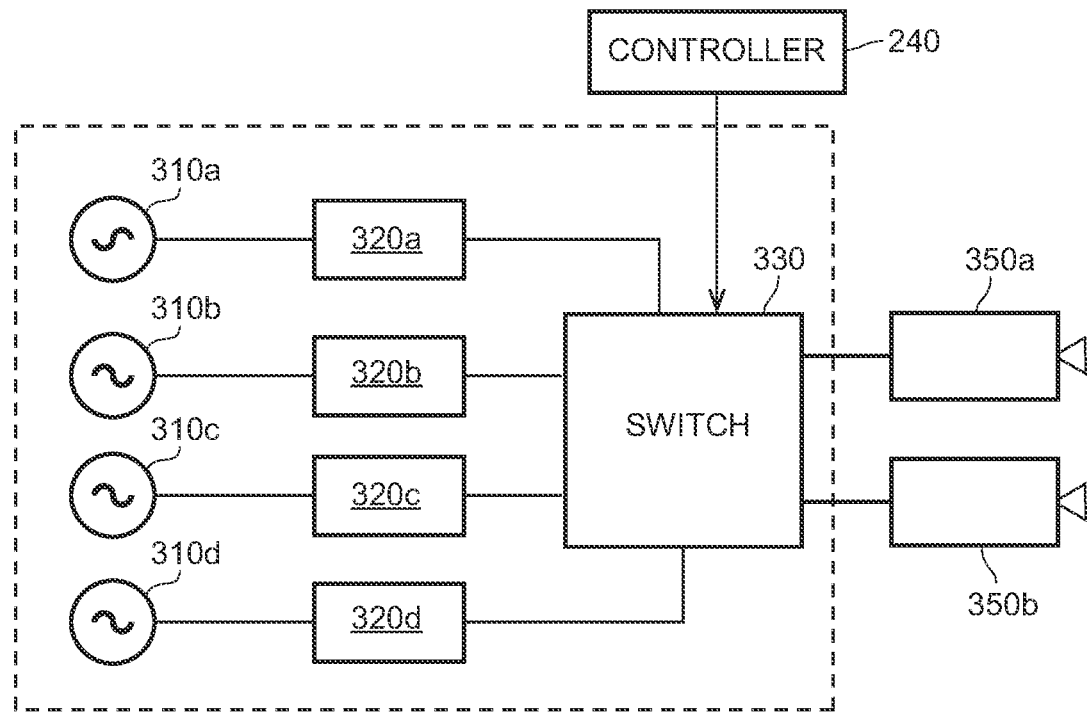
FIG. 3A is a block diagram of an example source of microwave power that includes multiple microwave generators, and that can power one or more thrusters, in a redundant and/or combined manner.

FIG. 3A illustrates an architecture for directing signals from multiple microwave oscillators or generators to one or more MET thrusters. The example architecture includes four generators 310a-d, each generating a respective signal. The signals may be substantially continuous wave (CW) signals in the range of 1-20 GHz. In some implementations, the signals may have substantially different frequencies (e.g., with frequency differences no less than 1 kHz, 10 kHz, 100 kHz or another suitable minimum difference). In other implementations, the signals may have substantially similar frequencies (e.g., with frequency differences less than 1 kHz, 100 Hz, 10 Hz or another suitable minimum difference) . The architecture 300 may include phase adjustment components 320a-d configured to adjust the phase of each of the corresponding signals corresponding to each of the generators 310a-d. The architecture 300 may then direct the phase-shifted signals to a switching network 330. The switching network 340 may include a suitable number of routing devices, including splitters, combiners, electro-mechanical switches, micro-electro-mechanical system (MEMS) switches, solid state switches, etc. The switching network 340 may provide an output to one of two MET thrusters 350a,b. In some implementations, only one MET thruster may be used, while more than two MET thrusters may be used in other implementations.

Some of the generators 310a-d may be configured to phase-lock to generate signals of substantially the same frequency and with substantially consistent pair-wise phase differences between phase difference between phase-locked generators. In some implementations, the phase adjustment components 320a-d may be filters. In other implementations, the phase adjustment components 320a-d may be delay lines. In either case, the phase-adjustment components 320a-d may be tunable. In some implementations, a controller adjusts the phases of the components 320a-d to facilitate phase-locking or to increase the power output of the combined signals.

The switching network 340 may direct output to a single MET thruster (i.e., coupling energy into the resonant cavity of the MET thruster). In other implementations, the switching network may direct one portion of the output to one thruster and another portion of the output to another thruster. In a redundant MET thruster system that includes multiple microwave generators 310a-d and multiple MET thrusters 350a,b, the switching network 340 may direct a subset of the signals generated by the generators 310a-d, to one or both of the MET thrusters 350a,b.

Figure 3B:
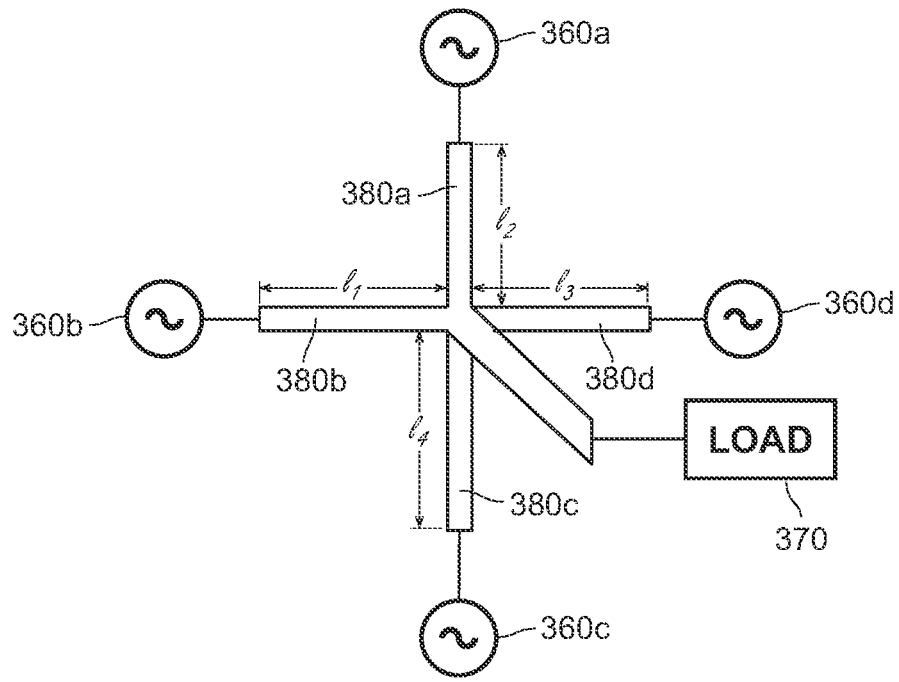
FIG. 3B schematically illustrates an example placement of multiple microwave generators relative to a load.

FIG. 3B illustrates an example three-dimensional placement of microwave oscillators or generators 360a-d relative to a load 370, which can be the resonant cavity, for example (such as the resonant cavity 281 discussed with reference to FIG. 2). The generators 360a-d are interconnected via respective transmission or wave guides 380a-d. The lengths of the guides 380a-d can be adjusted so that the generators 360a-d are phase-locked and configured to increase the power delivered to the load 370.

Figure 4:
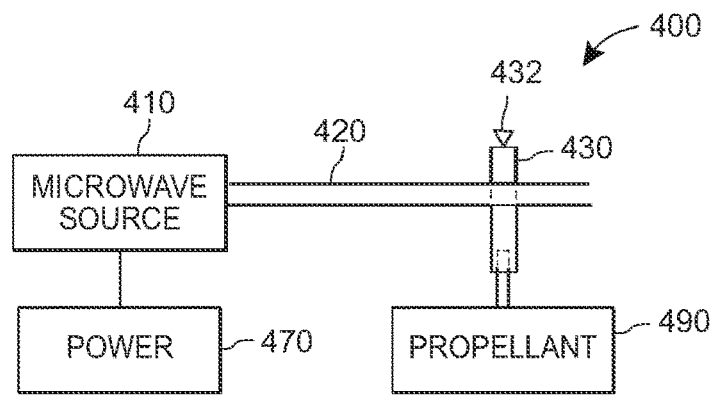
FIG. 4 is a block diagram of an example thruster system which a propellant compartment is disposed through a waveguide, so as to eliminate the need for a dedicated resonant cavity.

FIG. 4 illustrates a MET thruster configuration 400 that does not require a resonant cavity. Instead, the microwave source 410 delivers energy via a waveguide 420 to a propellant compartment 430 disposed through the waveguide 420. The propellant compartment 430 includes a nozzle 432. The microwave energy delivered to the propellant compartment 430 ignites a plasma and heats the gaseous propellant that generates thrust by expanding through the nozzle 432. A power system 470 (e.g., the power system 270 of FIG. 2) may supply energy to the microwave source 410, while a propellant system 490 (e.g., the propellant system 290) may supply the propellant to the propellant compartment 430. Thus, the MET thruster configuration 400 may operate within the spacecraft system 210.

Figure 5:
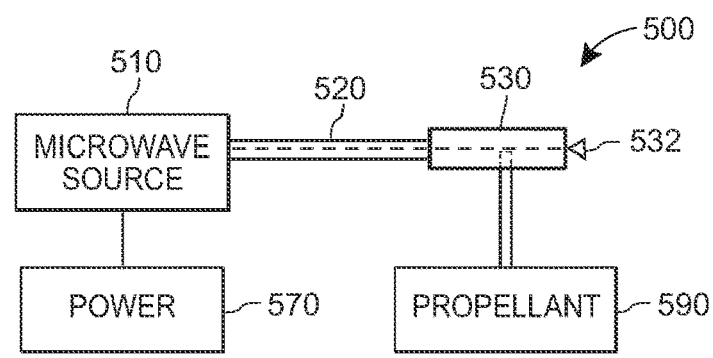
FIG. 5 is a block diagram of an example thruster system in which a propellant is injected into a coaxial transmission line.

FIG. 5 illustrates another MET thruster configuration 500. The microwave source 510 delivers energy via a coaxial transmission line 520 to a propellant compartment 530 disposed between a center conductor and a shield (an outer conductor) of a section of the coaxial transmission line 520. The microwave energy delivered to the propellant compartment 530 ignites a plasma and heats the gaseous propellant that generates thrust by expanding through the nozzle 532. A power system 570 (e.g., the power system 270 of FIG. 2) may supply energy to the microwave source 510, while a propellant system 590 (e.g., the propellant system 290) may supply the propellant to the propellant compartment 530. A section of the coaxial transmission line proximal to the nozzle 532 and including the propellant compartment 530 may form a resonance cavity. In some implementations, a section of the coaxial transmission line 520 may include an impedance transformation section with coaxial stubs, quarter-wave impedance transformer, or another suitable impedance matching circuit. The center conduct of the coaxial transmission line 520 within the propellant compartment 530 may be coated with a dielectric material to protect it from degradation caused by plasma. Further, the coaxial transmission line 520 can include a dielectric window to define the propellant compartment 530 (i.e., separate a one portion of the coaxial transmission line from another portion of the coaxial transmission line in which the hot gas is contained).

Figure 6A:
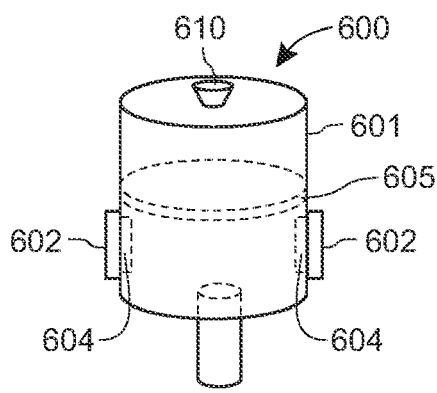
FIG. 6A schematically illustrates placement of magnets along the walls of the cylindrical housing of the resonant cavity to cooperate with one or more ferrite inserts disposed inside the resonant cavity and automatically tune the resonant cavity.

Now referring to a configuration 600 of FIG. 6A, a MET thruster of this disclosure in some implementations includes a resonant cavity 601 (which can be similar to the resonant cavity 281 discussed above and include a dielectric window 605 separating the cavity into two compartments), the resonant frequency of which a controller (e.g., the controller 240 of FIG. 2) can tune. In particular, to counteract the impact of the plasma generated within the resonant cavity 601 during operation of the MET thruster on the resonant frequencies of the resonant cavity 601, one or more magnets 602 exert a magnetic bias onto a ferrite insert 604 disposed inside the resonant cavity 601. In the example implementation of FIG. 6A, the one or more magnets 602 are electromagnets which the controller can activate and deactivate as needed.

For example, the controller 240 can activate the electromagnet(s) 602 when at least a portion of the propellant inside the resonant cavity 601 is ionized. As discussed in more detail with reference to FIG. 15 below, the propellant entering the resonant cavity 601 at an initial stage of operating the MET thruster can heat up and remain unionized until a certain time (and, at a time $T_3$ in FIG. 15), when the propellant begins to form plasma and accordingly begin to impact the resonant frequencies of the resonant cavity 601. The controller 240 can determine this time using temperature sensors disposed in or near the resonant cavity 601 or, in another implementation, by determining the amount of time elapsed since the propellant began entering the resonant cavity at a certain flowrate and using a look-up table to determine when the controller 240 should activate the electromagnets 602.

In the implementation of FIG. 6A, the one or more magnets 602 are disposed along the vertical wall of the cylindrical housing of the resonant cavity 601 (with the position of a nozzle 610 defining the vertical orientation of the resonant cavity 601). The corresponding ferrite insert(s) 604 are disposed inside the resonant cavity 601, along the vertical wall of the cylindrical housing, so that the vertical wall of the resonant cavity 601 separates each of the one or more magnets 602 from the corresponding ferrite insert 604. A waveguide 620 couples microwave energy to the resonant cavity 601 at the base of the cylindrical housing of the resonant cavity 601.

Figure 6B:
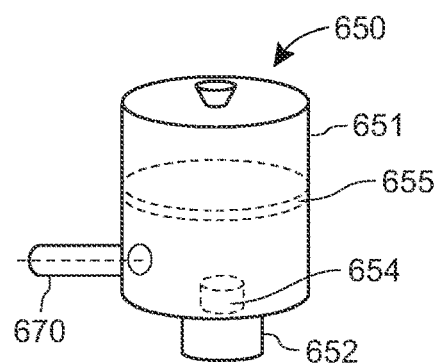
FIG. 6B schematically illustrates placement of magnets at the base of the cylindrical housing of the resonant cavity to cooperate with one or more ferrite inserts disposed inside the resonant cavity and automatically tune the resonant cavity.

On the other hand, in the configuration 650 of FIG. 6B, the one or more magnets 652 are disposed outside the base of the cylindrical housing of the resonant cavity 651 (which also can be similar to the resonant cavity 281 discussed above and can include a dielectric window 655), at an end opposite to the end at which the nozzle 660 is disposed. The ferrite insert 654 is disposed inside the resonant cavity 651 at the base of the cylindrical housing, so that the plate at the base of the resonant cavity 651 separates each of the one or more magnets 652 from the corresponding ferrite insert 654. A waveguide 670 couples microwave energy to the resonant cavity 651 at a vertical wall of the cylindrical housing of the resonant cavity 651.

In some implementations, a MET thruster implements a combination of the techniques of FIGS. 6A and 6B. More generally, a MET thruster can include one or more ferrite inserts at any suitable locations within the resonant cavity and one or more magnets disposed at the suitable corresponding locations outside the resonant cavity. Moreover, in the some implementations the magnets can be permanent (e.g., rare earth magnets) mechanically actuated to interact with the ferrite inserts.

Next, several example techniques for coupling microwave energy to a propellant in a resonant cavity are discussed next with reference to FIGS. 7A and 7B.

Figure 7A:
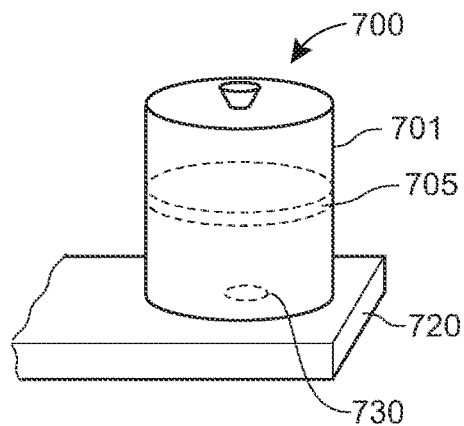
FIG. 7A illustrated an example coupling of microwave energy into a resonant cavity using a waveguide that abuts the base of the cylindrical housing of the resonant cavity.

Referring first to a configuration 700 of FIG. 7A, a resonant cavity 701 includes a dielectric window 705 and is disposed within a cylindrical housing, similar to the resonant cavity 281 discussed above. A waveguide 720 abuts the base of the cylindrical housing, at an end opposite to the end where a nozzle 710 is disposed. The waveguide 720 can have a rectangular cross-section for example. The waveguide 720 couples electromagnetic energy from a microwave source, such as the microwave source 288 of FIG. 2, into the resonant cavity 701 via an aperture 730. In this implementation, the aperture 730 has a round shape.

Figure 7B:
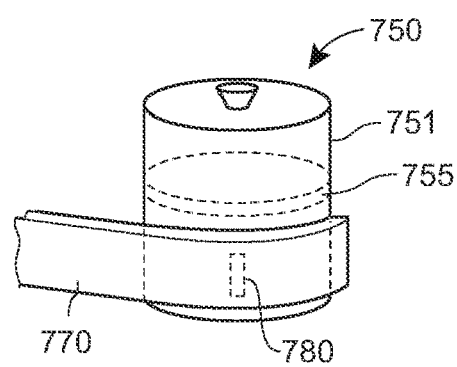
FIG. 7B illustrated an example coupling of microwave energy into a resonant cavity using a waveguide that abuts the wall of the cylindrical housing of the resonant cavity along at least a portion of the circumference of the cylindrical housing.

According to the configuration 750 of FIG. 7B, a resonant cavity 751 also includes a dielectric window 755 and is disposed within a cylindrical housing, similar to the resonant cavity 281 discussed above. However, a waveguide 770 wraps around at least a portion of the circumference of the cylindrical housing. The waveguide 770 thus abuts the vertical wall of the cylindrical housing. The waveguide 770 includes an aperture in the shape of a narrow slit, with the longer dimension of the slit parallel to the axis of the resonant cavity 751 (i.e., the axis of the cylindrical housing).

In some implementations, the waveguide 770 includes multiple apertures in the section that abuts the cylindrical housing of the resonant cavity 751, so as to increase coupling efficiency. For example, the waveguide 770 can include two, three, four, etc. apertures shaped similar to the aperture 780, via each of which the microwave source can deliver microwave energy into the resonant cavity 751.

In yet other implementations, a waveguide similar to the waveguide 720 or 770 can define a tangent to the circumference of the resonant cavity, and couple electromagnetic energy from a microwave source into the resonant cavity via a single aperture.

Figure 8A:
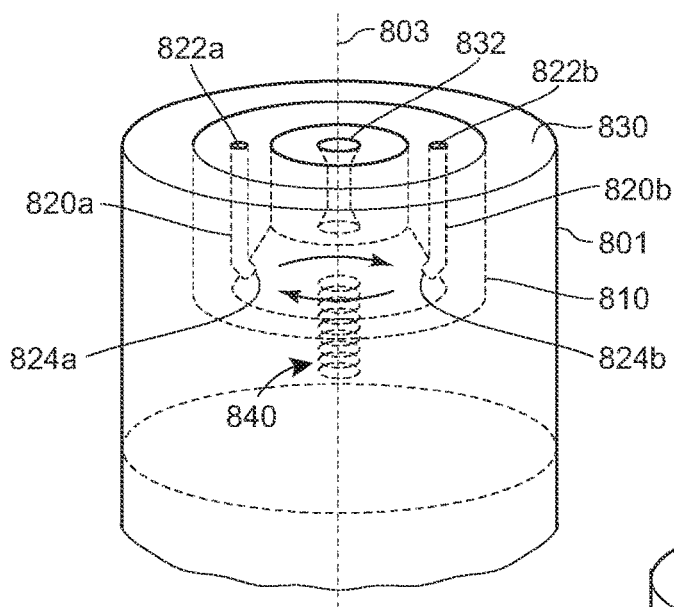
FIG. 8A is a perspective view of an example resonant cavity with an annular structure that extends into the resonant cavity along the thrust axis to support injectors of the propellant.

Now referring to FIG. 8A, an example resonant cavity 801 includes an annular structure 810 that extends into the resonant cavity 801 along the thrust axis 803 to support or include one or more injectors 820. In this implementation, two injectors 820A and 820B are separated from each other by 180 degrees along a circumference concentric with the circumference of the annular structure. In other implementation, the annular structure 810 supports four injectors, separated by each other by 60 degrees. More generally, the annular structure 810 can support N injectors, which can be separated from each other by 360/N degrees (or another suitable angular distance).

The annular structure 810 in this implementation does not extend above a top plate 830 which supports a nozzle 832. The annular structure 810 in other implementations can extend above the top plate 830. As a more particular example, the annular structure 810 can form an exit cone of the nozzle 832. In other implementations, the nozzle 832 has an integral structure, including an exit cone, and is provided separately of the annular structure 810.

In any case, the annular structure 810 can include channels extending from the respective inlets 822A and 822B into the cavity 801 to define injectors 820A and 820B, or the channel can receive hollow tubes of the injectors 820A and 820B. The injectors 820A and 820B are configured to create or improve a rotating circumferential flow of the hot gas in the cavity 801. To this end, the annular structure 810 can define a suitable geometry for the injectors 820A and 820B, e.g., curve the channels of the injectors 820A and 820B so that the propellant enters the cavity 801 at an angle relative to the thrust axis 803, or provide substantially straight channels at an angle to the thrust axis 803. In this manner, the injectors 820A and 820B impart angular momentum to the propellant entering the cavity 801, which in turns facilitates the creation of a rotating circumferential flow 840 of hot gas in the cavity 801. The annular structure 810 can orient the outlets 824A and 824B so that the injectors 824A and 824B impart angular momentum to the propellant along the same direction, e.g., clockwise as illustrated in FIG. 8A or counterclockwise.

Further, as illustrated in FIG. 8A, the annular structure 810 defines the location of outlets 824A and 824B of the injectors 820A and 820B, respectively. In particular, the annular structure 810 determines the respective locations of the outlets 824A and 824B in terms of a distance along the thrust axis 803 as well as in terms of a radial distance along a perpendicular to the thrust axis 803. The annular structure 810 thus can facilitate injection of the propellant close to the location within the cavity 801 where plasma is formed (rather than near the top plate 830 for example).

With continued reference to FIG. 8A, the annular structure 810 in an example implementation includes a section 850 with a radius that increases with the distance away from the nozzle 832. The section 850 thus is shaped as a conical frustum to further improve vorticity and facilitate the creation of a rotating circumferential flow of hot gas.

Figure 8B:
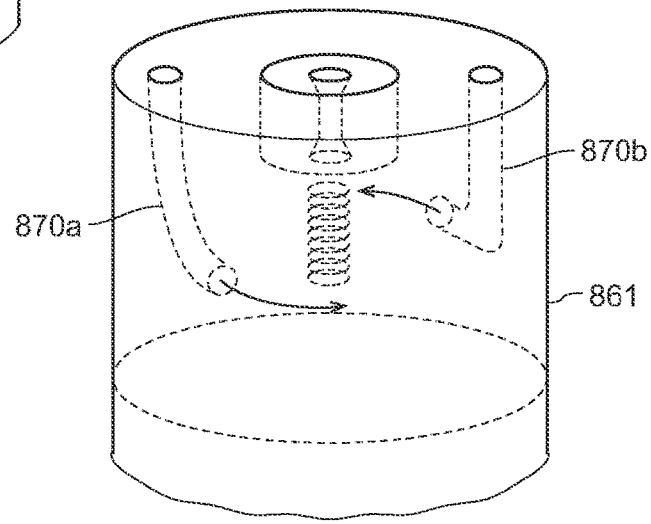
FIG. 8B is a perspective view of an example resonant cavity in which capillaries are used to deliver propellant into the resonant cavity.

FIG. 8B illustrates an example resonant cavity 861 in which the injectors 870A and 807B are implemented as capillaries. In this implementation, the capillaries are not supported by an annular structure, and the point at which propellant enters the resonant cavity 861 is defined by the shape and the material of the capillaries. Similar to the implementation of FIG. 8A, the injectors 870A and 807B can impart angular momentum to the propellant entering the cavity 861, which in turns facilitates the creation of a rotating circumferential flow of hot gas in the cavity 861.

Figure 8C:
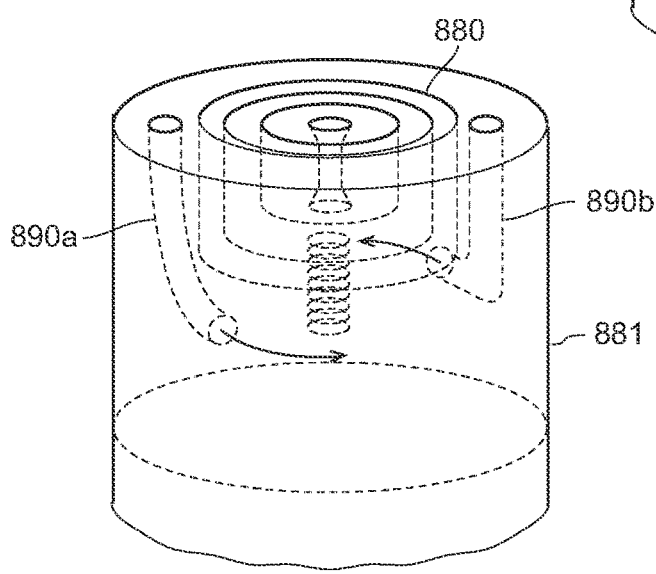
FIG. 8C is a perspective view of an example resonant cavity in which capillaries are used to deliver propellant into the resonant cavity, and an annular structure extends into the resonant cavity along the thrust axis to improve vorticity.

FIG. 8C illustrates an example resonant cavity 881 in which injectors 890A are 890B are implemented as capillaries disposed outside an annular structure 880 which, similar to the annular structure 810 of FIG. 8A, extends into the resonant cavity 881.

Figure 9A:
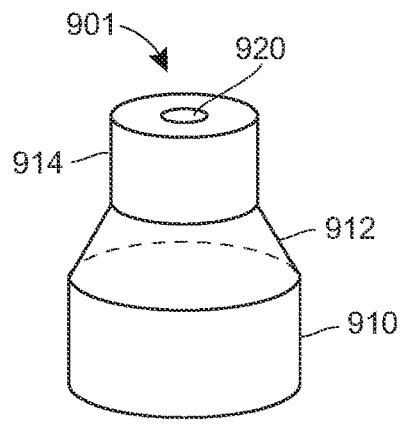
FIG. 9A illustrates an example geometry of a resonant cavity in which the varying diameter improves vorticity of the hot gas.
Figure 9B:
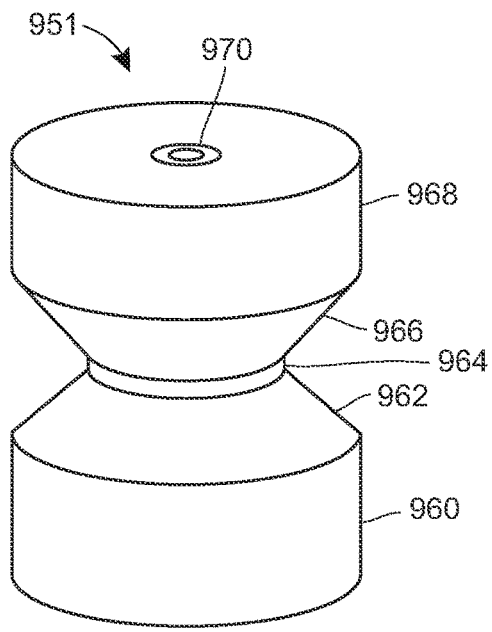
FIG. 9B illustrates another example geometry of a resonant cavity in which the diameter varying along two sections improves vorticity of the hot gas.

Next, FIGS. 9A and 9B illustrate several example geometries of a resonant cavity, which can be used as the resonant cavity 281 in the MET thruster of FIG. 2, for example. The resonant cavity 901 includes a bottom section 910, a middle section 912, and a top section 914 most proximate to a nozzle 920. In this implementation, the bottom section 910 and the top section 914 have a constant diameter, but the bottom section 910 has a wider diameter than the top section 914. The middle section 912 has a diameter that decreases along the cylinder axis, so that the portion of the middle section 912 closer to the nozzle 920 is narrower than the portion of the middle section 912 farther away from the nozzle 920. In this implementation, diameter decreases linearly, and the middle section 912 forms a conical frustum which can improve vorticity and facilitate the creation of a rotating circumferential flow of hot gas. More generally, the diameter need not vary linearly and can vary in any suitable manner (e.g., exponentially).

In the implementation of FIG. 9B, the resonant cavity 951 includes a bottom section 960, a first conical frustum section 962, a middle section 964, a second conical frustum section 964, and a top section 968 most proximate to a nozzle 970. The bottom section 960 and the top section 968 have the same constant diameter. The middle section 964 has a constant diameter smaller than the diameter of the bottom section 960 and the top section 968. The diameter of the first conical frustum section 962 decreases along the cylinder axis, so that the portion closer to the nozzle 970 is narrower than the portion farther away from the nozzle 970. The diameter of the second conical frustum section 966 increases along the cylinder axis, so that the portion closer to the nozzle 970 is wider than the portion farther away from the nozzle 970. The diameter can vary non-linearly in other implementations of the section 962 and/or the section 966. The geometry of the resonant cavity 951 also can improve vorticity and facilitate the creation of a rotating circumferential flow of hot gas.

Figure 10A:
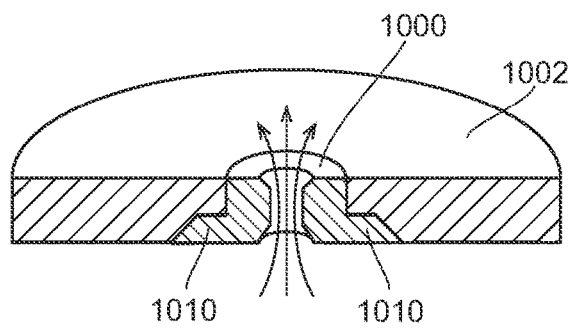
FIG. 10A illustrates an example monolithic nozzle disposed in a top plate of a resonant cavity.

Now referring to FIG. 10A, an example monolithic nozzle 1000 can be disposed in a top plate 1002 of a resonant cavity, such as the resonant cavity of 281 illustrated in FIG. 2. The entire nozzle 1000 can be made of the same material such as a ceramic, for example, or metal with ceramic coating. The nozzle 1000 can include a flange 1010 via which the nozzle 1000 attaches to the top plate 1002. The flange 1010 prevents the nozzle 1000 from being expelled due to pressure inside the resonant cavity.

Figure 10B:
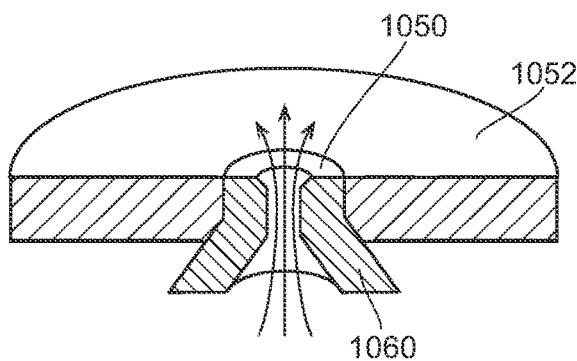
FIG. 10B illustrate an example configuration in which a nozzle insert extends into the cavity to increase the intensity of the electric field that acts upon the propellant.

In the implementation of FIG. 10B, an example monolithic nozzle 1050 similarly can be disposed in a top plate 1052 of a resonant cavity. The entire nozzle 1050 can be made of the same material. In this implementation, a portion 1060 of the nozzle 1060 extends into the resonant cavity to increase the intensity of the electric field that acts upon the propellant. The portion that extends into the cavity can prevents the nozzle 1060 from being expelled due to pressure inside the resonant cavity, similar to the flange 1010 of the nozzle 1000 discussed above.

Figure 11:
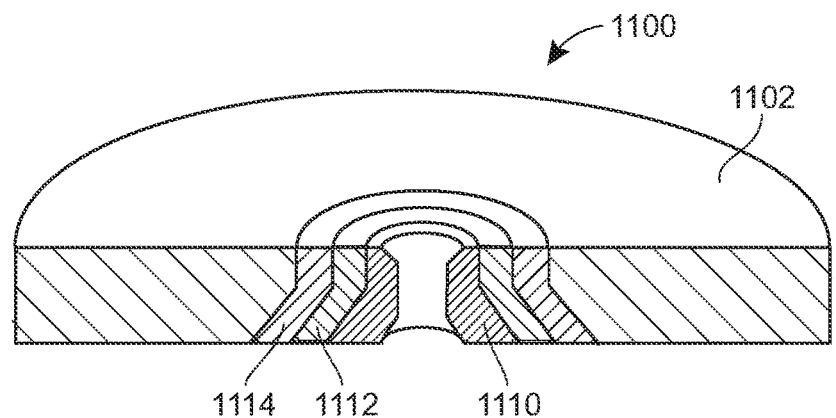
FIG. 11 illustrates an example configuration in which concentric annular inserts, made of materials with different coefficients of thermal expansion, reduce thermal stress exerted on the throat of the nozzle.

Next, FIG. 11 illustrates an example configuration 1100 in which concentric annular inserts 112 and 114 in a top plate 1102 surround a nozzle 1110. Although FIG. 11 illustrates two concentric annular inserts, in other implementations a single concentric annular insert is used or, conversely, more than two such inserts are used.

The top plate 1102 can be disposed at an end of a resonant cavity (e.g., the resonant cavity 281 discussed above). The top plate 1102 can be made of a certain material, such as steel or another suitable metal alloy or metal, with a first coefficient of thermal expansion (CTE) $\alpha_1$. The CTE of the material of the nozzle can be $\alpha_2$ different from $\alpha_1$. For example, the nozzle 1110 can be made of a ceramic material with a lower CTE than metal, or the nozzle 1110 can have a ceramic coating. Because the temperature may not distribute evenly through the top plate 1102 when plasma has formed in the resonant cavity, with areas closer to the nozzle 1110 heating up more than areas near the outer edge of the top plate 1102, the top plate 1102 may exert pressure on the nozzle 1110, which over time may lead to deterioration of the nozzle 1110. For example, the throat of the nozzle 1110 may get narrower or uneven.

In some implementations, the concentric annular insert 1112 is disposed between the nozzle 1110 and the top plate 1102 (directly adjacent to the top plate 1102 or adjacent via another one or more annular concentric inserts). The concentric annular insert 1112 has a coefficient of thermal expansion $\alpha_3$ different from $\alpha_2$ and $\alpha_1$. In an example implementation, $\alpha_3$ is smaller than $\alpha_2$ and $\alpha_1$. As a result, the concentric annular insert 1112 reduces the thermal stress which the top plate 1102 exerts on the nozzle 1110 and, in particular, on the throat of the nozzle. In another implementation, the CTE $\alpha_3$ is smaller than $\alpha_1$ but equal to or greater than $\alpha_3$. In yet another implementation, the concentric annular insert 1112 is made of an elastic material to absorb the stress exerted by the top plate 1102.

When multiple concentric annular inserts are used, the thermal coefficients of the concentric annular inserts can be selected so as to provide values between layers, e.g., the CTE $\alpha_4$ of the concentric annular insert 1114 can be between the CTEs $\alpha_3$ and $\alpha_1$ of the concentric annular insert 1112 and the top plate 1102, respectively.

Figure 12A:
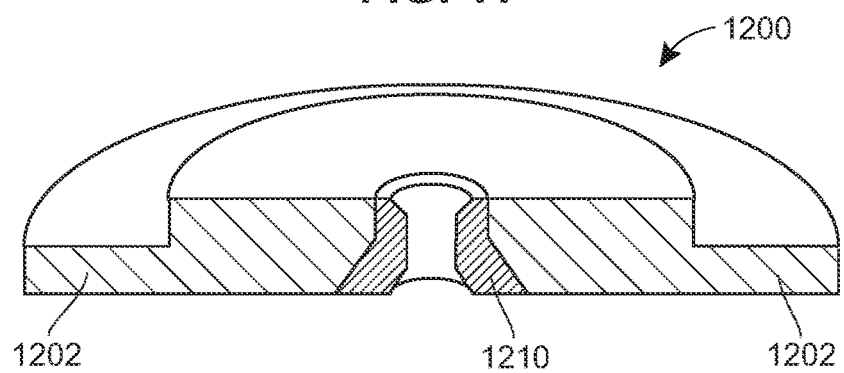
FIG. 12A illustrates an example nozzle adapter for simplifying the testing of various nozzles in a thruster system.
Figure 12B:
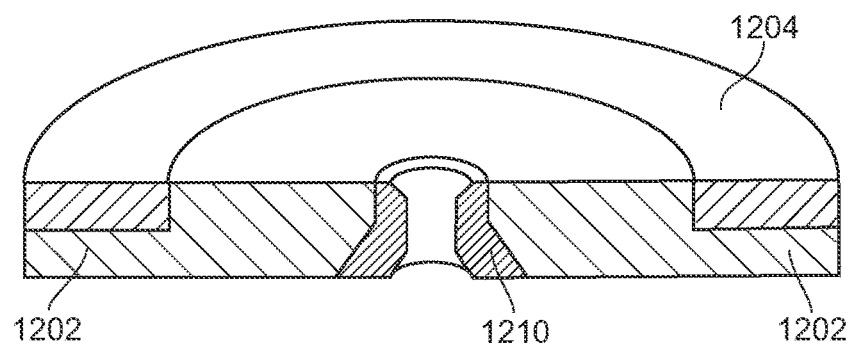
FIG. 12B illustrates the nozzle adapter of FIG. 12B mated with the top plate of a resonant cavity.

Now referring to FIGS. 12A and 12B, in some cases it is desirable to be able to test nozzles of different geometries and/or composition with a certain resonant cavity. A configuration 1200 illustrates an adapter 1200 configured to removably attach to a top plate 1204 (illustrated in FIG. 12B), which can be disposed at an end of a resonant cavity. For example, the adapter 1200 can include a flange 1202 that exerts a force on the top plate 1204 to prevent the adapter 1200 from being expelled by pressure within the resonant cavity. The adapter 1202 supports a nozzle 1210. In some situations, it may be easier to form an adapter similar to the adapter 1200 for a desired nozzle than adapt a nozzle directly to the top plate 1204.

Figure 13:
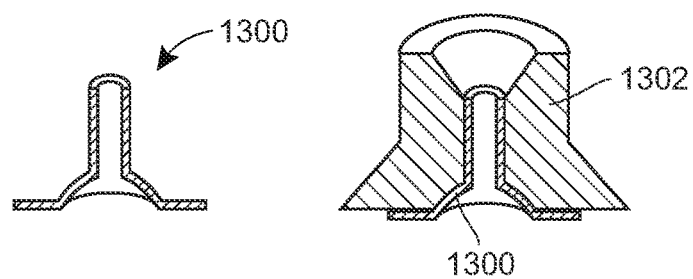
FIG. 13 illustrates an example nozzle insert which can be used to protect the throat of a nozzle.

Next, FIG. 13 illustrates an example nozzle insert 1300 which can be used to protect the throat of a nozzle 1302. The nozzle insert 1300 can be made of a refractory metal or another suitable material that can reduce the oxidation of the nozzle 1302. In one example implementation, the nozzle insert 1300 is made of iridium. In another example implementation, the nozzle insert 1300 is made of niobium. Although FIG. 13 illustrates a single-layer nozzle insert 1300, in general a suitable nozzle insert can be have any suitable number of layers (e.g., two, three, four).

Figure 14A:
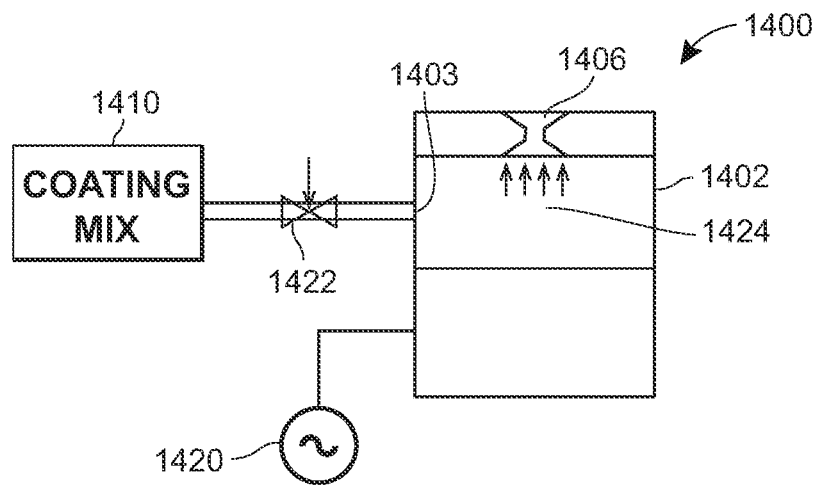
FIG. 14A is a block diagram of an example configuration in which a coating mix for depositing a coating material onto the inner surface of a nozzle can be injected into a resonant cavity during manufacturing.

FIG. 14A is a block diagram of an example configuration 1400 in which a coating mix 1410 for depositing a coating material onto the inner surface of a nozzle 1406 can be injected into a resonant cavity 1402 during manufacturing. In particular, during manufacturing of the nozzle 1406, a controller (which need not be associated with a spacecraft) can provide a control signal 1420 to a valve 1422 disposed in a fluid line between a pressurized tank with the coating mix 1410 and the resonant cavity 1402. The controller can cause the coating mix 1410 to be injected into the resonant cavity 1402 via an inlet 1403 when a microwave source 1420 (which can be similar to the microwave source 288 for example) can couple electromagnetic energy generated into the resonant cavity 1402. The energy produces hot gas 1422 from the coating mix 14010 in the resonant cavity 1402, and the pressure in the resonant cavity 1402 expels the hot gas 1424 via the nozzle 1406. When traveling through the throat of the nozzle 1406, the hot gas coats the throat (the interior surface) of the nozzle 1406 with a coating material.

The coating material in various implementations can be (or can include) oxide ceramics, non-oxide ceramics, or a refractory metal such as tungsten. Further, in some implementations the hot gas coats the throat of the nozzle with a diamond film or a sapphire film. To this end, the coating mix 210 includes a coating agent, so that the coating or film deposited onto the throat of the nozzle 1406 is a chemical product of the coating agent.

After undergoing the procedure schematically illustrated in FIG. 14A, the nozzle 1406 alone, or along with the resonant cavity 1402 can be deployed in a spacecraft. In some implementations, the resonant cavity 1402 receives a propellant via the same inlet 1403. Thus, a thruster installation including the resonant cavity 1402 and the nozzle 1406 can operate in a first mode in which the microwave energy produces hot gas to coat the nozzle 1406, and a second mode in which the microwave energy produces hot gas from the propellant to generate thrust, when the spacecraft is deployed in space.

Figure 14B:
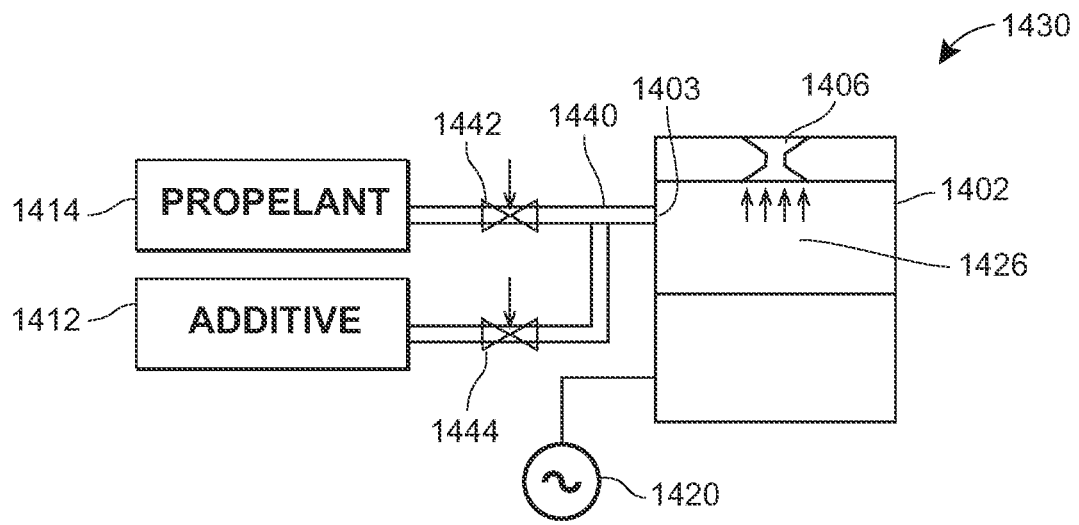
FIG. 14B is a block diagram of an example configuration in which a coating mix for depositing a coating material onto the inner surface of a nozzle can be injected into a resonant cavity in a certain operational mode of the thruster.

FIG. 14B is a block diagram of an example configuration 1430 in which an additive 1412 for depositing a coating material onto the inner surface of the nozzle 1406 can be injected into the resonant cavity 1402 in a certain operational mode of the thruster. In particular, the same or similar resonant cavity 1402 with the inlet 1403 can be coupled to a fluid line 1440 via which the controller of the spacecraft (e.g., the controller 240 of FIG. 2) can selectively cause only the propellant 1414 to be injected into the resonant cavity 1402, or a mixture of the propellant 1414 and an additive 1412. To this end, the controller can operate valves 1442 and 1444. Similar to the coating mix 1410 discussed above, the additive 1412 in various implementations can be (or can include) oxide ceramics, non-oxide ceramics, a refractory metal such as tungsten, a coating agent that forms a diamond film or a sapphire film, etc. In one operational mode the microwave energy from the microwave source 1420 produces hot gas 1426 from the propellant 1414 and the additive 1412, and the pressure in the resonant cavity 1402 expels the hot gas 1426 via the nozzle 1406, thereby coating the throat of the nozzle 1406 with a coating material included in the additive 1412. In another operational mode, the hot gas is generated from the propellant 1414 alone.

Figure 14C:
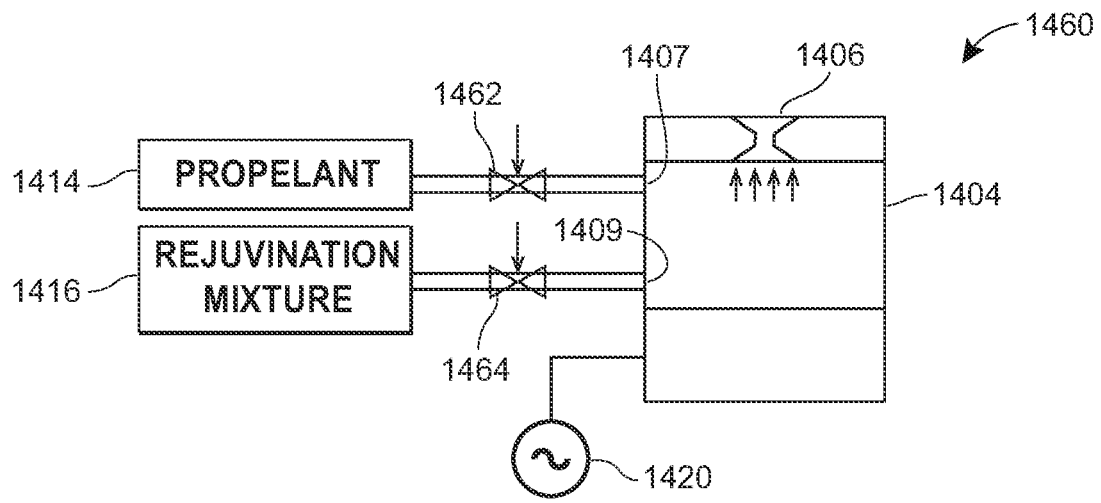
FIG. 14C is a block diagram of an example configuration in which a coating mix for depositing a coating material onto the inner surface of a nozzle can be injected into a resonant cavity along with the propellant.

FIG. 14C is a block diagram of yet another example configuration 1460 in which a coating mix for depositing a coating material onto the inner surface of a nozzle can be injected into a resonant cavity along with the propellant. A resonant cavity 1404 in this implementation includes two inlets 1407 and 1409 to receive a propellant 1414 or a "rejuvenation mixture" 1416, respectively. The rejuvenation mixture 1416 can be similar to the additive 1412, or include additional chemical agents suitable for protecting the nozzle 1406 from oxidation, erosion, etc. The controller can operate valves 1462 and 1462 to supply the propellant 1414, the rejuvenation mixture 1416, or both into the resonant cavity 1404.

Figure 15:
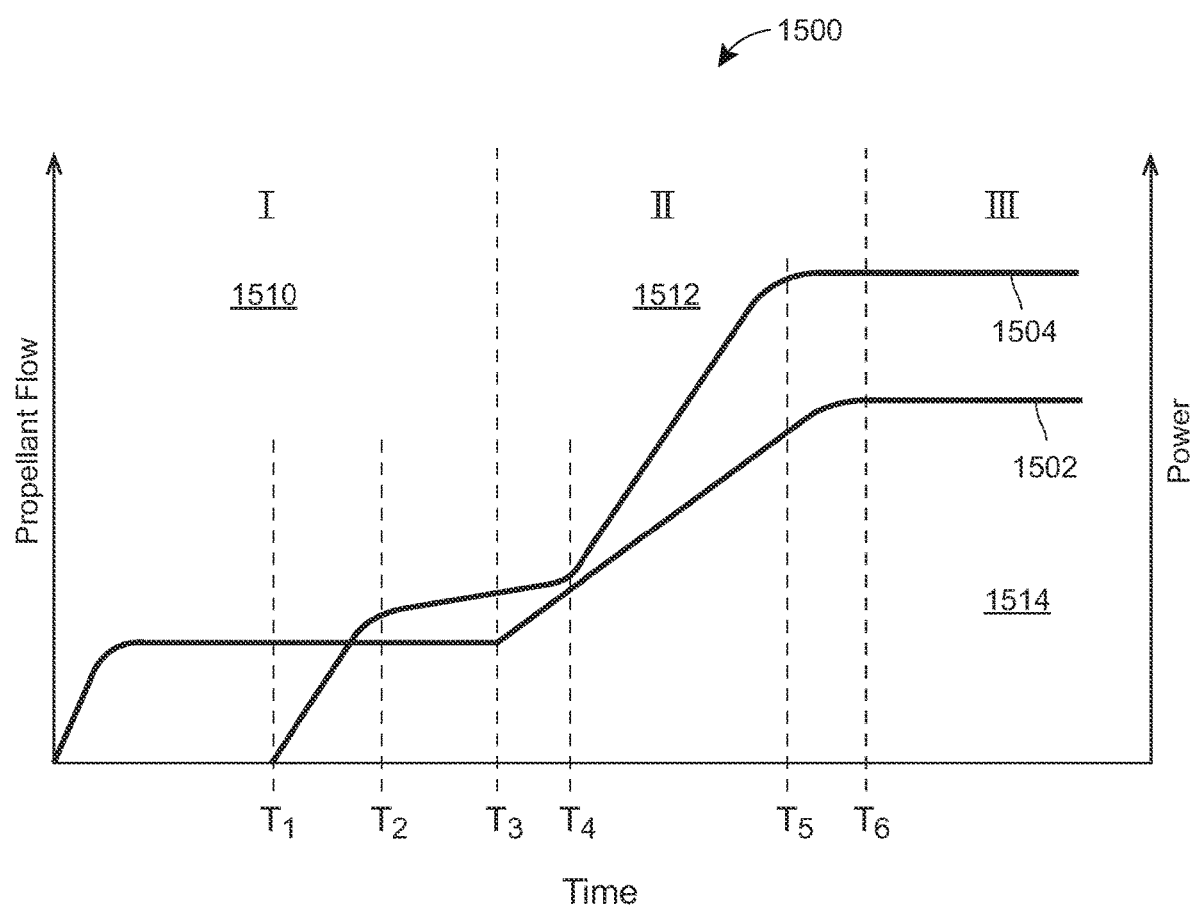
FIG. 15 illustrates power output of a microwave generator and a rate at which a propellant is injected into a cavity, plotted on a shared timeline, according to an example operation of a thruster system of this disclosure.

Finally, a diagram 1500 FIG. 15 depicts a curve 1504 representing power output of a microwave generator as well as a curve 1502 representing rate at which a propellant is injected into a resonant cavity, plotted on a shared timeline, according to which a MET thruster of this disclosure (e.g., the MET thruster system 280) can operate. Generally speaking, the diagram 1500 illustrates an ignition stage 1510, during which the thruster operates in an ignition mode, an intermediate stage 1512, during which the thruster ramps up the power and propellant flow, and a propulsion stage 1514, during which the thruster operates in a propulsion mode.

During the stage 1510, a controller of the thruster causes the propellant to start flowing into the resonant cavity at a first, relatively low and relatively constant, rate. As illustrated in FIG. 15, the controller operates the microwave source in the low-rate mode until time $T_3$, at which the thruster transitions from stage 1510 to stage 1512. At time $T_1$, subsequently to activating the flow of the propellant, the controller activates the power source and begins to supply the electromagnetic power to the resonant cavity. The controller ramps up the power until time $T_2$ (subsequent to time $T_1$ and prior to time $T_3$).

At time $T_2$, the controller determines (based on sensor inputs or using a look-up table, for example) that the propellant is approaching the state at which at least a portion of the propellant is ionized. The controller in this implementation starts increasing the power output more gradually until time $T_4$. Then, at time $T_3$, the controller determines that at least a portion of the propellant is ionized in the resonant cavity and begins to ramp up the flow rate. The controller can also ramp up the power, starting a later time $T_4$.

The controller can stop ramping up the power and the flow rate at times $T_5$ and $T_6$, respectively. The controller then cause the thruster to operate in the propulsion mode, in which both the power and the flow rate are at a relatively high and relatively constant level. In some implementations, the controller further can vary the flow rate of the propellant at the propulsion stage 1514 in accordance with the desired thrust, i.e., the graph 1502 can "plateau" at different levels.

In microwave electro thermal (MET) rockets, propellant gas is heated to high temperature in a small volume by an electric discharge from an intensely focused microwave field. The high temperature gas is focused into the throat of a rocket nozzle where the hot gas is extracted and accelerated to high velocity thereby producing efficient thrust. The hot gas is focused by action of swirling the gaseous propellant in the region outside of the electric discharge. It is a general principle that centrifugal forces acting on a rotating column of gas will concentrate hotter and less dense gases along the axis of rotation while cooler and more dense gases will be pulled away from the axis of rotation. The present system and method describes the placement of gas flow injectors surrounding the rocket nozzle and discharge region.

These and other features and advantages of the present system and method will be apparent to those skilled in the art from the following detailed description, taken together with the accompanying drawings, in which like reference numerals refer to like parts.

Figure 16:
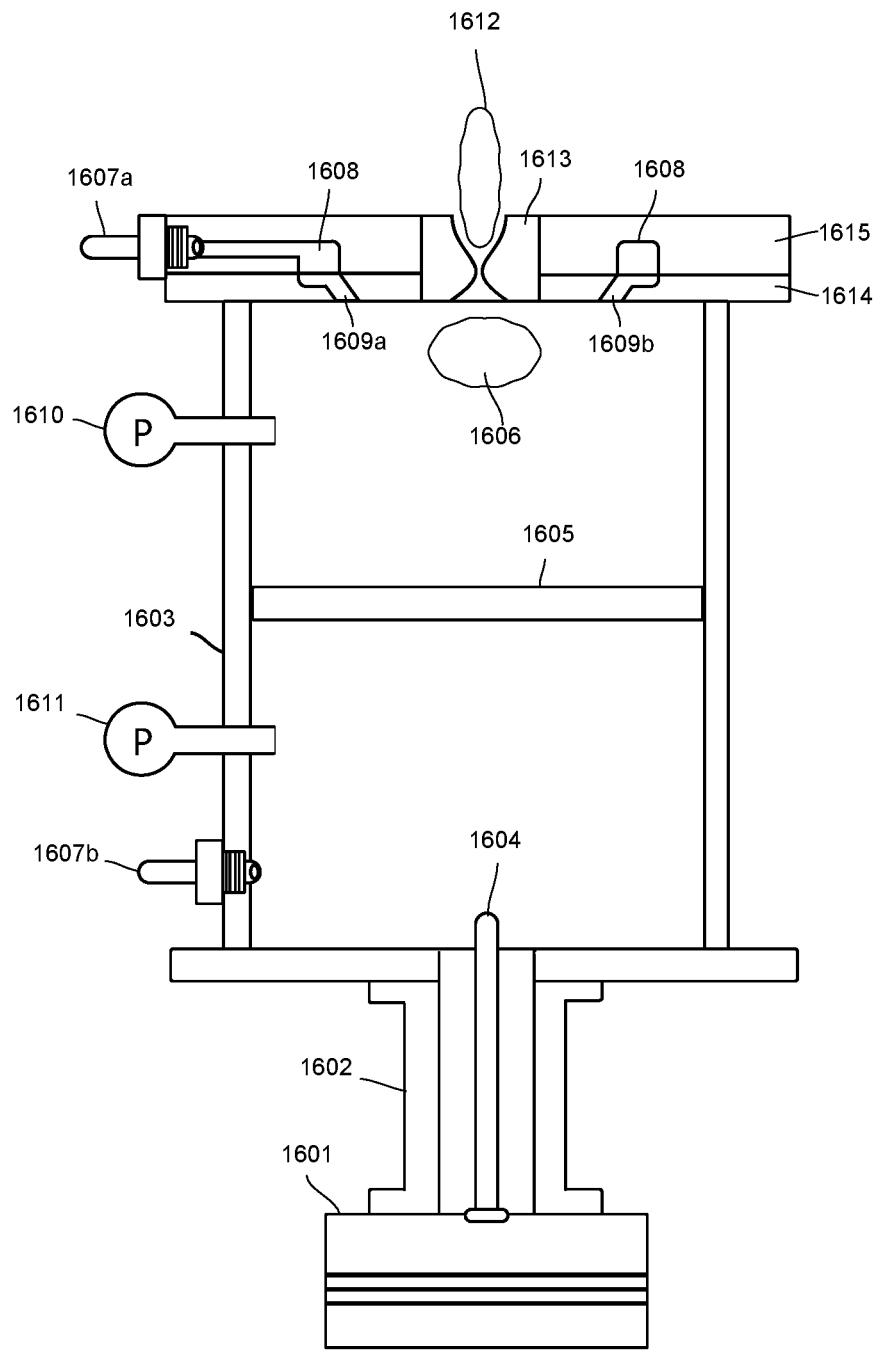
FIG. 16 illustrates a cross section view of an embodiment of a microwave electro-thermal (MET) rocket.

Referring to FIG. 16, a powerful source of microwave energy 1601, such as a magnetron, delivers microwave power through a coaxial transition structure 1602 to a hollow microwave resonator 1603. An antenna 1604 at the end of the coaxial structure 1602 causes microwave energy to radiate into the resonator 1603. The resonator 1603 is resonant at the frequency of the incoming microwave energy which causes an intense standing wave microwave field to fill the resonator.

A pressure-tight dielectric window 1605 divides the resonator 1603 into two compartments which may be independently pressurized. The dielectric window 1605 is substantially transparent to the microwave fields and does not disturb the standing wave pattern within the resonator 1603. Multiple gas feed connections 1607a and 1607b allow the two compartment halves to be separately pressurized with appropriate gasses. Pressures in the two compartment halves are independently monitored by pressure sensors 1610 and 1611.

Due to the intense microwave energy present near the end of the resonator, a localized electric discharge 1606 develops in the rotating propellant gas where it heats a small volume of the gas to high temperature. Gas pressure from continuous incoming gas forces the heated rotating gas flow into the throat of rocket nozzle 1613. The gas then exits through the rocket nozzle 1613 where it is accelerated to high speed 1612 producing rocket thrust. Rocket nozzle 1613 is further provided with means, such as a threaded connection, to permit it to be adjusted more or less protruding into the resonator 1603.

In this embodiment, the top endplate of the resonator 1603 is constructed in two parts in order to permit gas flow channels to be machined within the interior of the assembled top plate. The lower half of the top end plate, identified as part 1614, contains the gas injectors 1609a, b and the lower half of circumferential gas distribution channel 1608. The top half of the end plate, identified as part 1615, contains the gas feed connection 1607 and the gas flow channel and the upper half of circumferential gas distribution channel 1608. The gas injectors 1609a, b direct a propellant gas, such as water vapor, tangentially into the resonator 1603 to produce a rotating gas flow.

In this embodiment and method, the gas injectors 1609a, b may be placed at an optimal radial distance from the nozzle to best focus the electrical discharge 1606 toward the throat of nozzle 1613. In general, the optimal radial distance will depend on operational details of the rocket such as operating pressure, mass flow rate, and type of gas in use.

Figure 17:
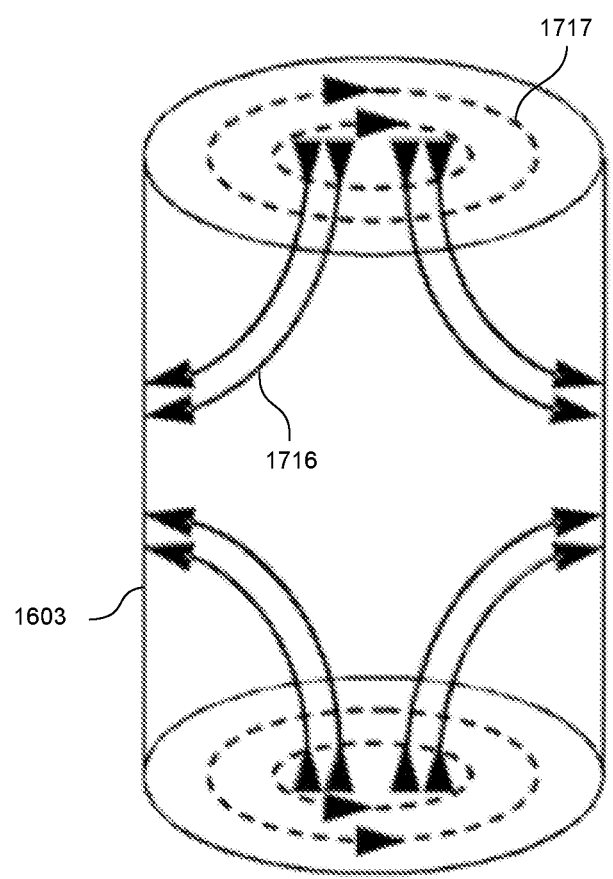
FIG. 17 is a perspective schematic view of the microwave fields inside the rocket.

Referring to FIG. 17, the standing wave fields inside resonator 1603 are indicated schematically. Electric fields 1716 are represented by curved solid curved arrows. Magnetic fields 1717 are represented by curved broken (dashed) arrows. The resonator 1603 is constructed in a size to support a TM011 standing wave mode. The resonator 1603 must be constructed in a size to match the wavelength of the microwave source 1601. This standing wave mode is chosen because it concentrates electric fields 1716 at the center of each end of the resonator. Highly intense concentrated electric fields provide the mechanism for producing a localized electric discharge 1606 in the propellant gas.

Figure 18:
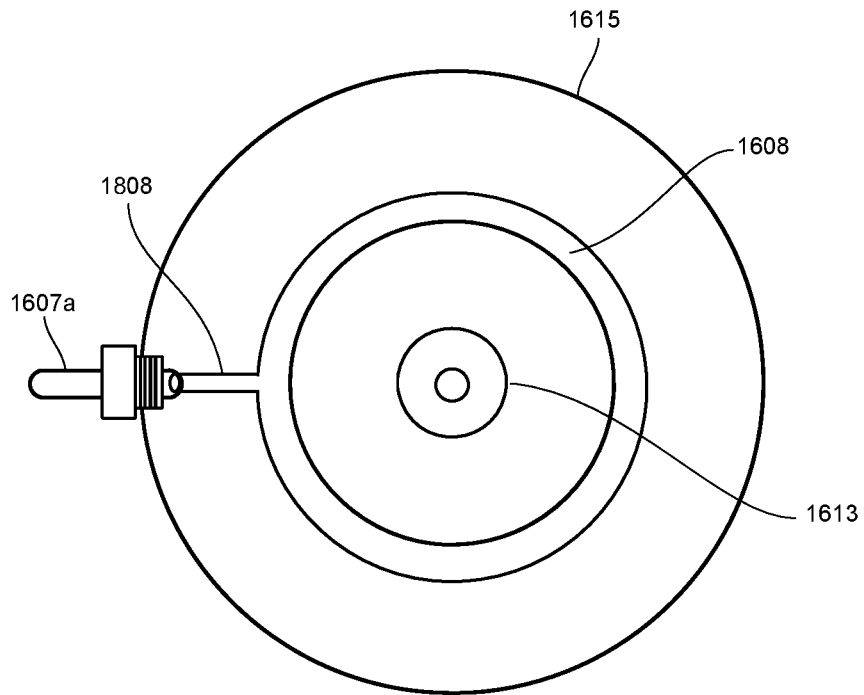
FIG. 18 illustrates details of the gas injectors in the first embodiment.

Referring to FIG. 18, the upper half of the top end plate, identified as part 1615, is shown in cross section. The propulsion gas enters the top plate through gas feed connection 1607a. Gas flows through gas flow channel 1808 and the upper half of circumferential gas distribution channel 1608. Part 1615 is able to direct gas to any number of gas injectors located in the lower half identified as part 1614 (in FIG. 19).

Figure 19:
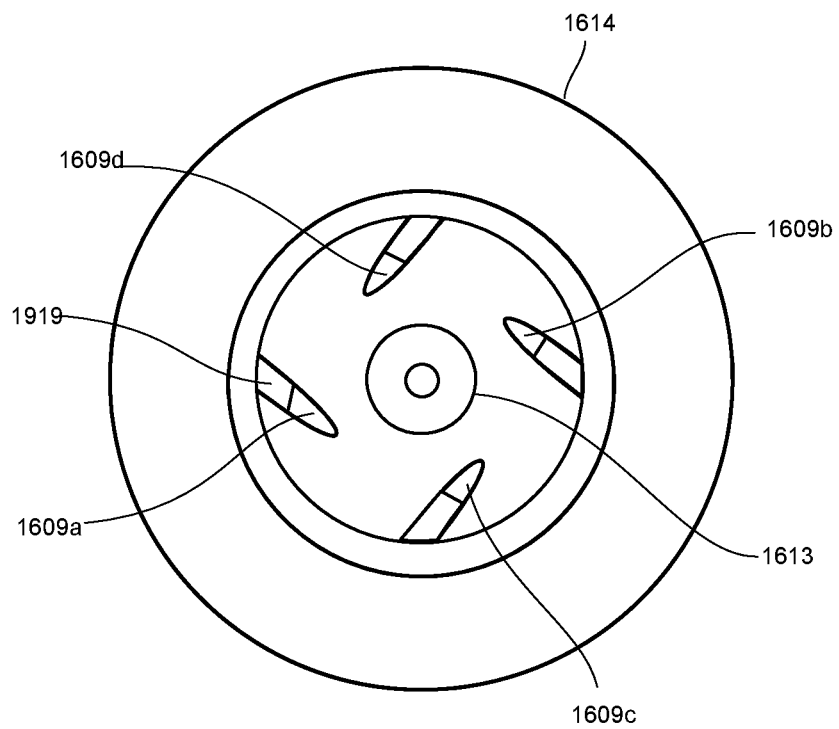
FIG. 19 illustrates additional details of the gas injectors in the first embodiment.

Referring to FIG. 19, the lower half of the top end plate, identified as part 1614, is shown in cross section. In this preferred embodiment, the swirl injectors 1609a-d are located close to the rocket nozzle 1613. The injectors 1609a-d connect to gas distribution channel 1608 through angled connector channels 1919. The connector channels 1919 and multiple gas injectors 1609a-c are angled in a circumferential direction to induce a rotating gas flow. They are further angled along the axial direction into the plane of part 1614 until they emerge at the lower surface of the top end plate 1615. In this manner, rotating gas may be injected close to the end plate of resonator 1603 and also close to the electrical discharge 1606.

The nozzle 1613, as discussed above, is typically made from a refractory material such as ceramic or tungsten metal. The view of the nozzle 1613 in this figure is looking through the throat from inside the resonator 1603.

Figure 20:
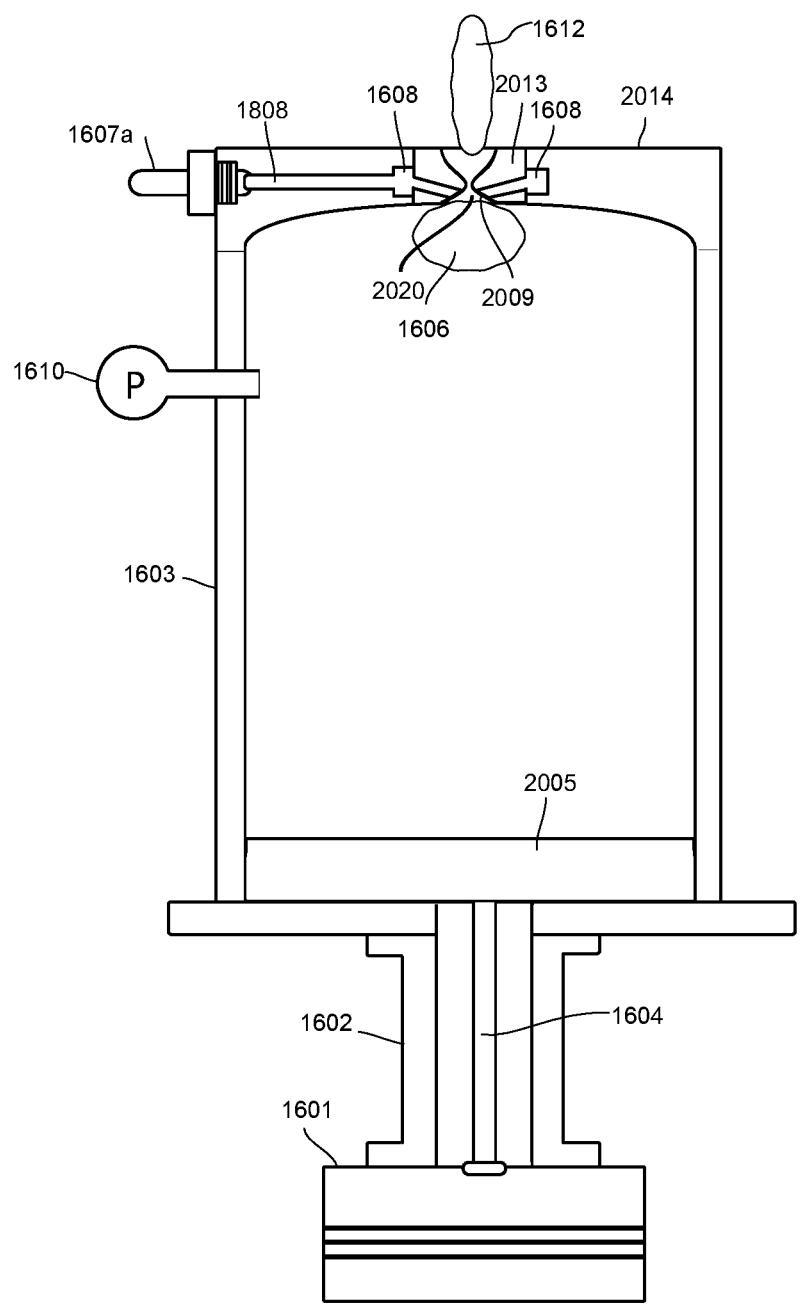
FIG. 20 illustrates a cross section of another embodiment of a MET rocket.

FIG. 20 shows a second embodiment of a MET rocket. In this embodiment, the pressure-tight dielectric window 2005 has been moved to the bottom of the resonator 1603, leaving a single pressurized compartment within the resonator 1603. At the upper end of resonator 1603, the top end plate is fabricated from a single plate 2014. In this embodiment, the gas injectors 2009 are positioned directly into the nozzle body 2013 in close proximity to the throat 2020 of the rocket nozzle.

Figure 21:
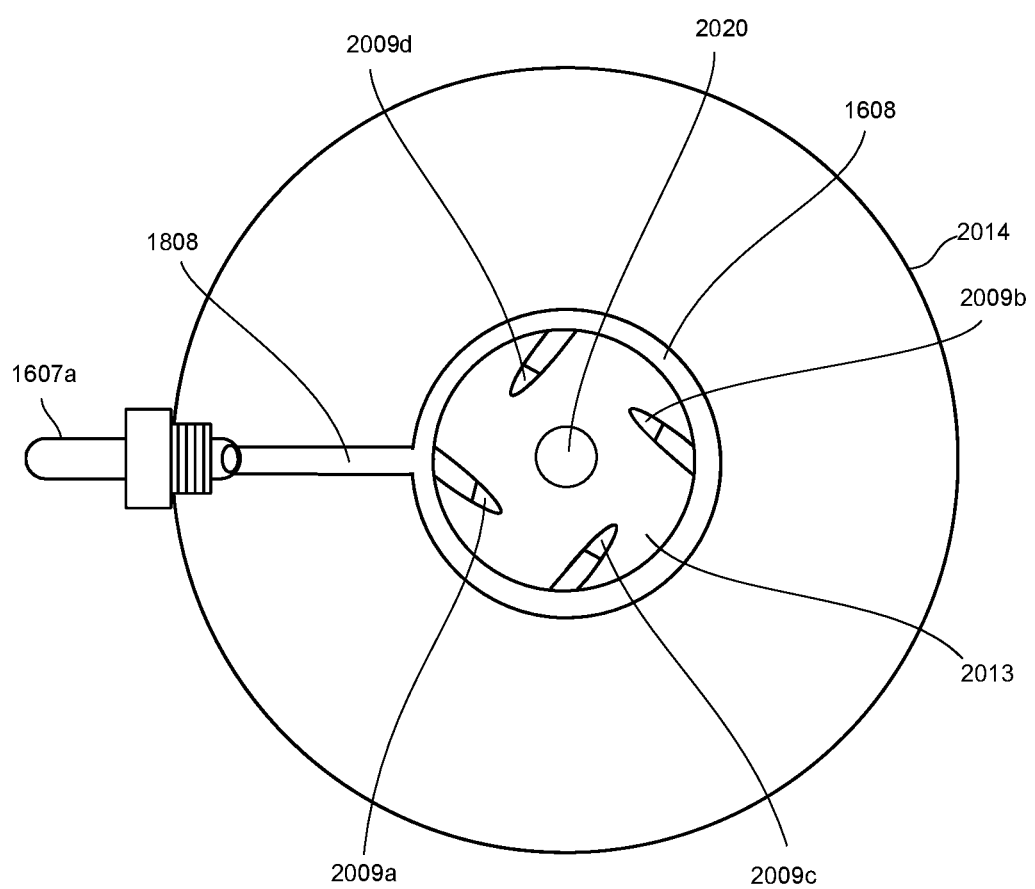
FIG. 21 illustrates details of the gas injectors in the embodiment of FIG. 20.

FIG. 21 is an end view of the second embodiment of FIG. 20. It shows details of the placement of gas injectors 2009a-d as they surround the nozzle throat 2020.

Rockets have been constructed with two key features: i) a pressure resistant chamber contains a hot propellant gas at high pressure, ii) the hot pressurized propellant gas then passes from the chamber into the throat of a rocket nozzle. A converging-diverging expansion nozzle serves to extract a flow of gas from the chamber and accelerate the flow to high velocity, thereby producing efficient thrust.

When hot gas is produced by combustion of fuel and oxidizer, the pressure resistant chamber is usually termed a combustion chamber, and the propellant gas consists of a mixture of gaseous combustion products. When propellant gas is heated by non-combustion means such as electrical heating, optical heating, or other directed energy heating means, then the pressure resistant chamber may be termed a propulsion chamber.

The usefulness of a rocket system is increased by efficient conversion of the input thermal energy, whether from chemical or electrical means, into produced thrust. It is preferred to minimize thermal energy losses by reducing thermal heat flow out of the propellant gas and through the walls of the propulsion chamber and the walls of the expansion nozzle. The heat loss problem is increased when rocket thrusters are reduced in size. Smaller thrust chambers have more surface area per total volume than larger chambers which leads directly to reduction in thermal efficiency.

Heat loss mitigation methods provide for the use of heat-resistant or refractory materials in the walls of the propulsion chamber and nozzle. Refractory materials allow the surfaces to operate at high temperatures, thus providing minimal cooling where they are in contact with hot gas contained by chamber or nozzle walls. The hot walls are then further insulated circumferentially along to contain the high surface temperatures and to minimize heat flow to other supporting structures through processes of conduction or radiation.

The present method and system provide heat containment without need for refractory materials in the propulsion chamber. They further provide for naturally cooler propulsion chamber walls without conducting substantial heat away from the contained hot gasses. They further provide for reduced heat loss through the nozzle walls, thereby improving thermal efficiency. They further provide for efficient focusing and containment of the hottest gasses into and through the central portion of the nozzle throat, thereby reducing nozzle erosion and extending operating lifetime.

The present method employs physical rotation of the entire propulsion chamber and nozzle, which we shall term the propulsion assembly. The axis of rotation is disposed to be collinear with the symmetry axis of the propulsion assembly and aligned along the centerline of the nozzle throat. In one embodiment, for a propulsion assembly of 5 cm diameter, a typical rotation speed may be 1800 rpm, which is the rotation speed of a motor for a small electric cooling fan. Many other sizes and rotation speeds are possible, as will become apparent to persons knowledgeable in the field.

Rotation of the propulsion assembly causes the contained hot gasses to also rotate due to friction with the chamber walls. After a time period of a few seconds needed to reach steady state conditions, the contained gasses match the rotation speed of the chamber walls. Thereafter, there is little appreciable shear motion between the chamber walls and the contained gas motions. In the rotating configuration, centrifugal forces act upon the contained gasses. Cooler heavier gasses are forced away from the rotation axis while lighter hotter gasses are forced toward the rotation axis. The cooler and hotter gasses are separated due to such buoyancy effects. For dimensions of the above-mentioned propulsion assembly, the acceleration forces operating on the gas at the chamber walls will exceed 90 times earth gravity.

In one preferred embodiment, the propulsion gas is water and heat is supplied by an electric arc. A portion of the propulsion assembly volume is occupied by liquid water. The remaining volume is occupied by gaseous water vapor. When rotating, a thick film of liquid water is held firmly and laminarly against the chamber walls without friction or shear forces between the liquid water and the chamber walls. The absence of relative motion between liquid water and chamber walls is preferred to reduce mechanical energy losses and to stabilize the inertial mass distribution of the liquid water thereby enhancing spacecraft controllability. The interior of the chamber is occupied by water vapor. A high voltage electric arc is discharged between two electrodes disposed within the chamber. The electrodes are separated by a few centimeters and aligned along the axis of rotation. The electric arc heats a small volume of water vapor to high temperatures. Buoyant forces cause the electric arc to be tightly focused along the rotation axis. When an electrically conducting rocket nozzle is substituted for one of the two electrodes, the high temperature water vapor arc is focused directly into the nozzle throat. At the same time, the temperature of the chamber walls can never exceed the temperature of boiling water.

The present method may be applied to both chemical and electric-powered rocket systems of various sizes, dimensions and proportions, and various propellant gasses; such as hydrazine, ammonia, argon, methane, propane, and carbon dioxide. These and other features and advantages of the present system will be apparent to those skilled in the art from the following detailed description, taken together with the accompanying drawings, in which like reference numerals refer to like parts.

Figure 22:
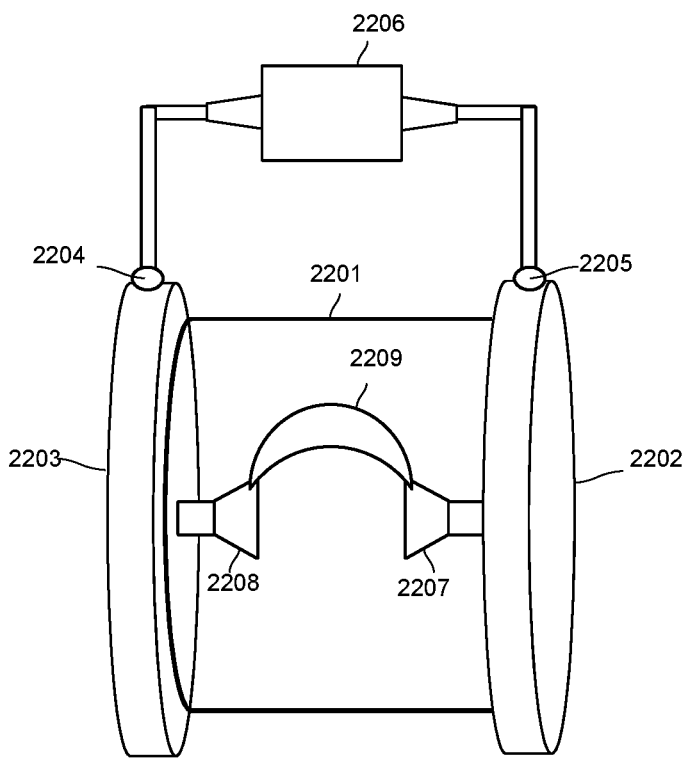
FIG. 22 is a schematic view of one embodiment of a chamber of a propulsion assembly.

FIG. 22 illustrates an example configuration of a portion of a propulsion system for heating propellant with an electric arc. A cylindrical chamber 2201 is closed at each end with metal end plates 2202 and 3. The chamber 2201 may be filled with gas (e.g., air at atmospheric pressure). Sliding electrical contacts 2204 and 2205 may provide electrical connections to a source of high voltage 2206. The end plates 2202 and 2203 may support conducting electrodes 2207 and 2208 respectively. The electrodes 2207 and 2208 may be positioned along the central axis of symmetry of the chamber 2201. The high voltage causes an electrical arc 2209 to strike between the electrodes 2207 and 2208. Due to buoyancy effects in gravity, the electrical arc 2209 may rise due to heating and have low stability, moving about when buffeted by air currents. An example source of high voltage 2206 may be configured to deliver up to 15 kV of 60 HZ alternating voltage at 450 watts into the electrical arc 2209.

Figure 23:
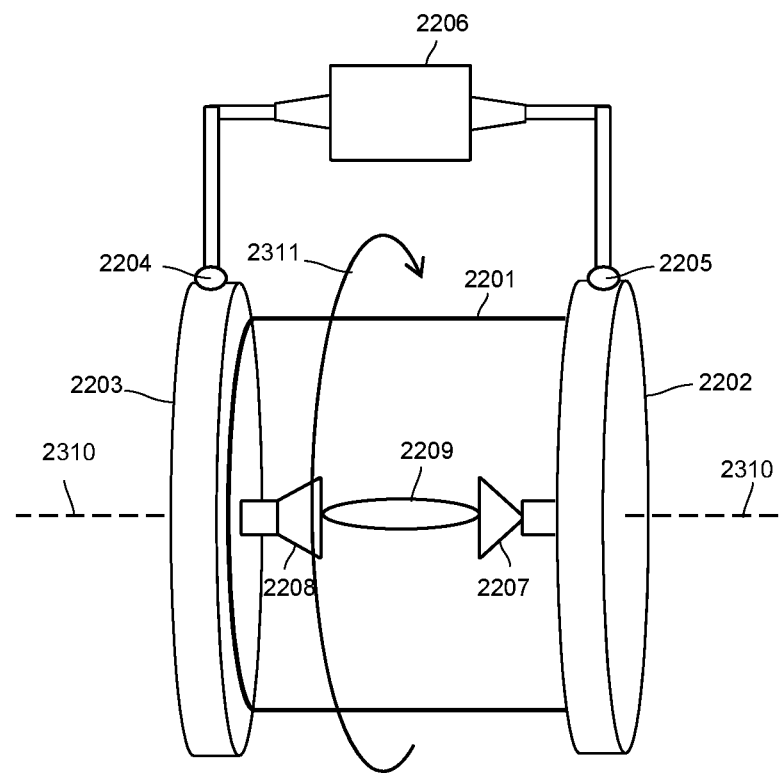
FIG. 23 is a schematic illustration of the assembly of FIG. 22 illustrating the rotational features of the system.

FIG. 23 illustrates the chamber 2201 together with end plates 2202 and 2203 set into rotational motion about a symmetry axis 2310, shown as a broken line. The direction of rotation is indicated by a curved arrow 2311. Moderate rotation rates can produce centrifugal accelerations within the chamber 2201 which substantially exceed the acceleration due to earth's gravity. Buoyancy effects may cause dense cooler air to be forced away from the rotation axis while warmer less dense air may be focused along the axis of rotation. The hot electric arc 2209 may, consequently, be tightly focused along the axis of rotation.

Figure 24:
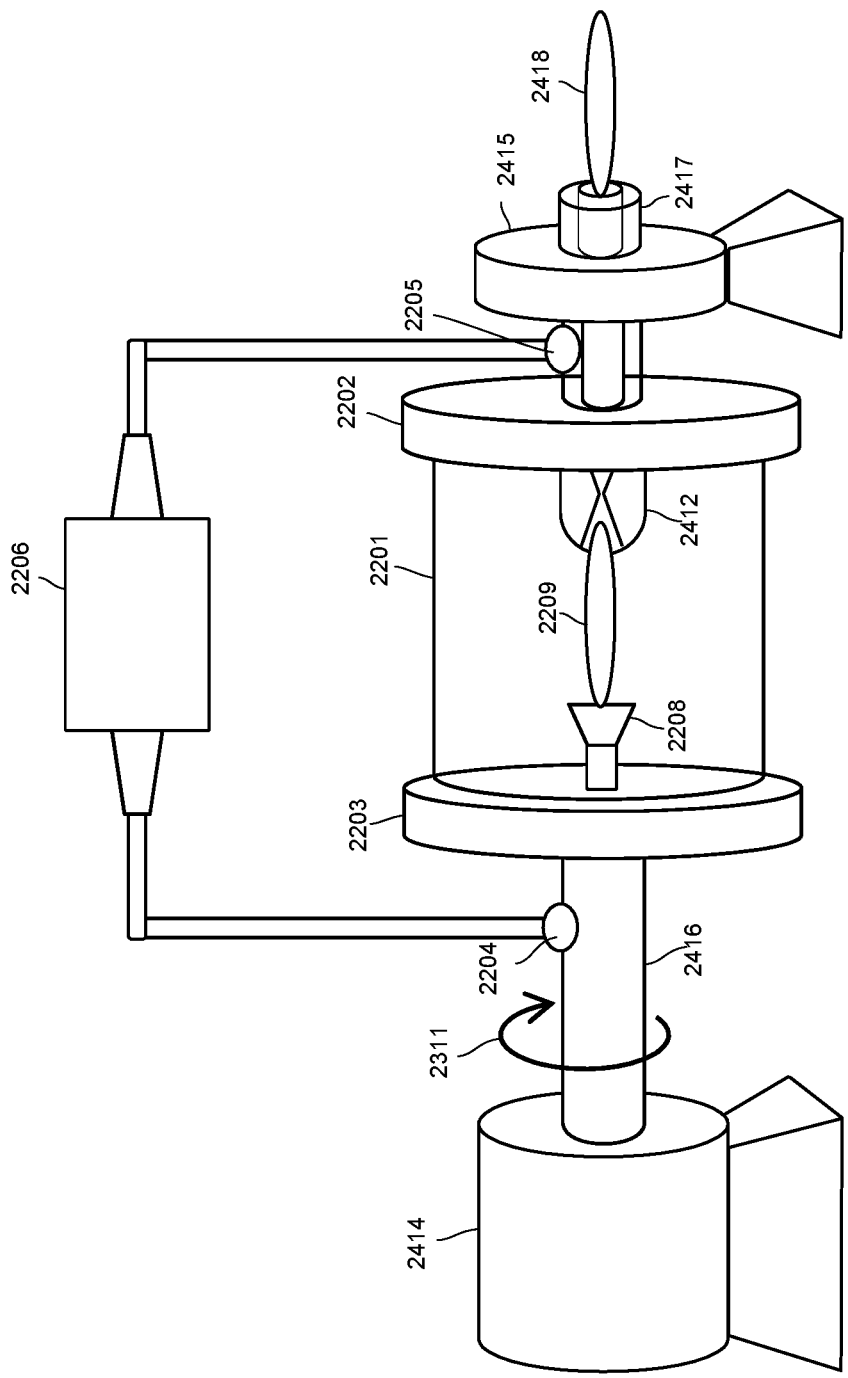
FIG. 24 is a schematic illustration of a rotational mounting of the propulsion assembly.

In FIG. 24, an example system configuration for rotating the chamber 2201 and adapting the chamber 2201 for propulsion are illustrated. Motor 2414 and shaft 2416 drive the rotational motion of the end plate 2203 and the chamber 2201. The electrical arc 2209 forms between the electrode 2208 and the input throat of a metal nozzle 2412. The end plate 2202 is supported by the hollow shaft 2417 and the support bearing 2415. The hollow shaft 2417 allows high velocity gas 2418 to exit the nozzle 2412 and produce thrust.

Figure 25:
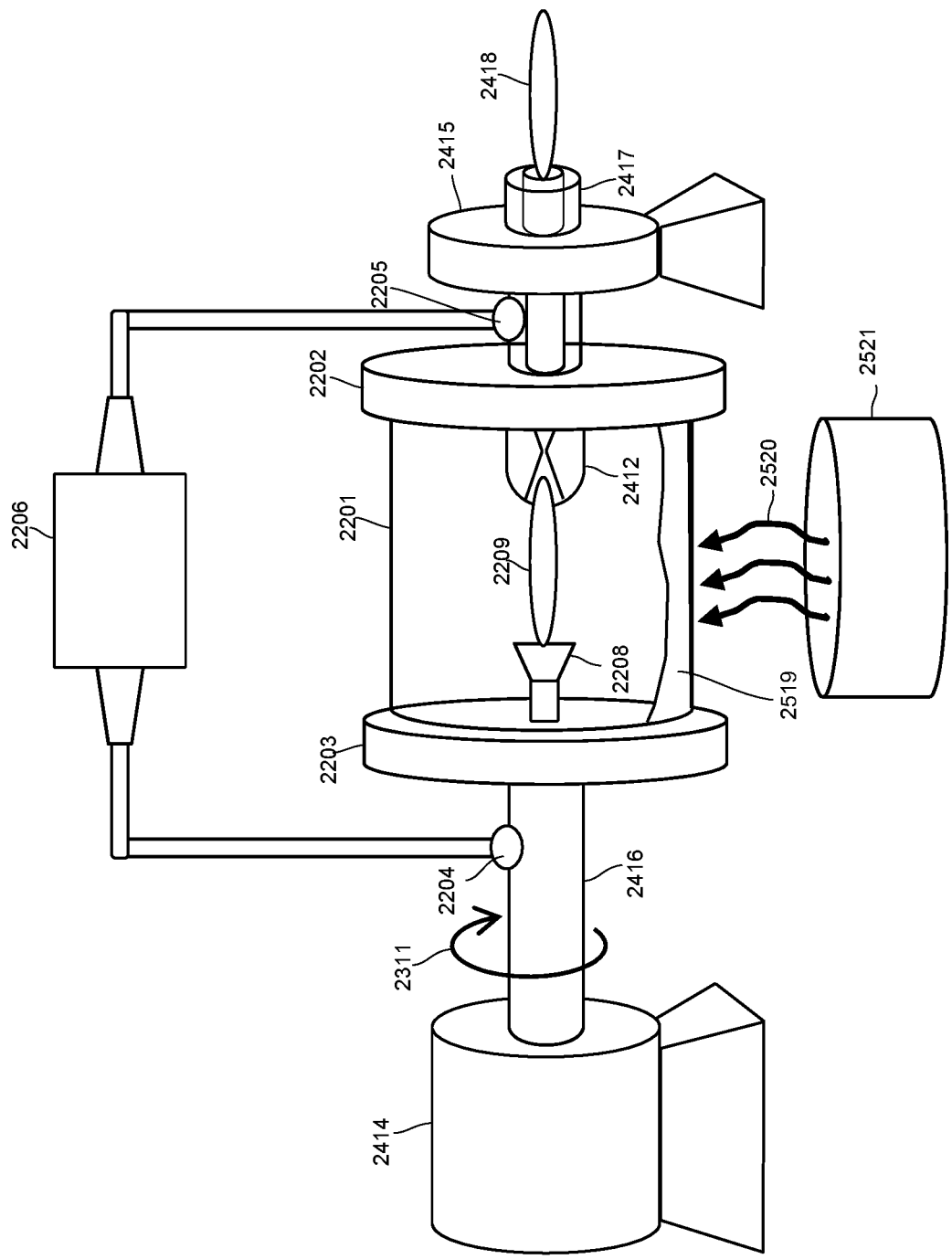
FIG. 25 is a schematic illustration of the assembly in which heat is added to the rotating chamber.

FIG. 25 illustrates an example system for adding heat to the rotating the chamber 2201 (e.g., at 1800 RPM) for the purpose of producing vapor propellant from a liquid. The chamber 2201 may be partially filled with water 2519. The outer wall of chamber 2201 receives heat 2520 from combustion (e.g., of a solid fuel) or any suitable heat source 2521. The addition of heat 2520 may cause the water 2519 to boil, and the water vapor may serve as the gaseous propellant. High voltage from the voltage source 2206 may cause the electrical arc 2209 to form between electrode 2208 and nozzle 2412. The electrical arc 2209 in water vapor may be tightly focused directly into the throat of nozzle 2412.

Figure 26:
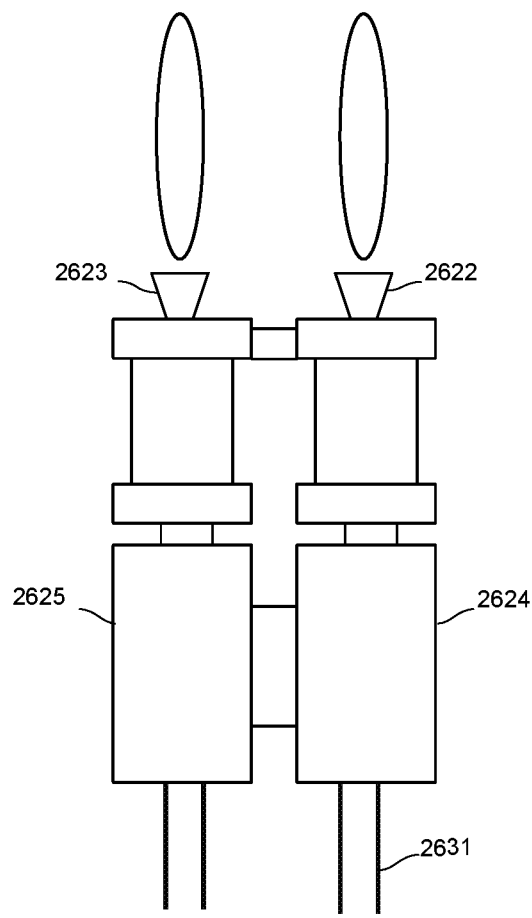
FIG. 26 is a schematic illustration of a dual counter-rotational assembly of thrusters as integrated into an example spacecraft.

FIG. 26 illustrates a configuration for employing rotating thrusters in a spacecraft. In space operations, it is advantageous to control the total vector-angular-momentum of a spacecraft to a value as close to net zero as possible. Any non-zero angular momentum may cause the spacecraft to rotate. In the illustrated embodiment, two similar rotating thrusters 2622 and 2623 are caused to rotate simultaneously at similar rate but in opposite directions by counter rotating electric motors 2624 and 2625. By counter rotating the thrusters, the angular momentum contribution from the thrusters may be controlled (e.g., set to substantially zero). Slight mass imbalances between the two thrusters may be precisely compensated by controlling the differential speed of the driving motors 2624 and 2625 through electrical drive cables 2631. Alternatively, the two thrusters 2622 and 2623 may be intentionally operated at different rotation speeds for short periods of time in order to intentionally rotate the spacecraft to a new orientation.

Figure 27:
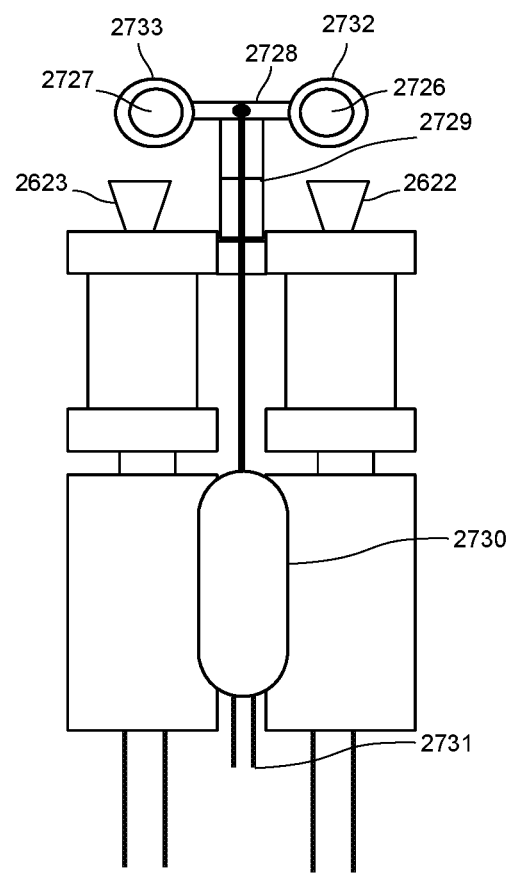
FIG. 27 illustrates additional details, of the assembly of FIG. 26.

Referring to FIG. 27, a system is illustrated for controlling water leakage from rotating thrusters. Counter rotating thrusters 2622 and 2623 are provided with articulated support structure 2728 and end caps 2726 and 2727. The end caps 2726 and 2727 are provided with compliant surface material which may be closed against the exhaust ports of the thrusters 2622 and 2623 to prevent water leakage. The end caps 2726 and 2727 may be opened or closed upon electrical command of the actuator 2730 through electrical drive cables 2731. The end caps 2726 and 2727 are further provided with bearings 2732 and 2733 which allow free rotation of the end caps 2726 and 2727 in the closed position. The two thrusters 2622 and 2623 may be operated at different rotation speeds with the end caps 2726 and 2727 in either open or closed position.

Figure 28:
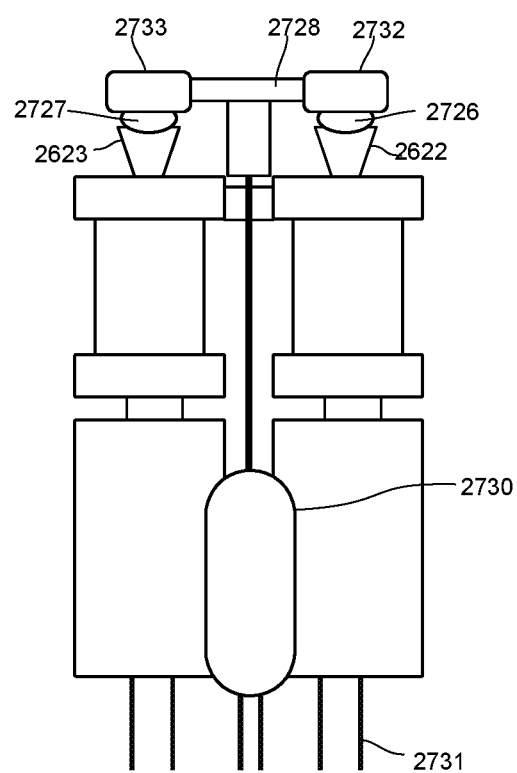
FIG. 28 illustrates further details of the assembly of FIG. 26.

FIG. 28 illustrates the system when the end caps 2726 and 2727 are in the closed position. Bearings 2732 and 2733 allow free rotation of thrusters 2622 and 2623 and the end caps 2726 and 2727 in the closed position.

The following list of aspects reflects a variety of the embodiments explicitly contemplated by the present disclosure.

Aspect 1. A thruster system for use in a spacecraft comprises a microwave source; a resonant cavity coupled to the microwave source, wherein the microwave source is configured to generate a standing wave field in the resonant cavity; a nozzle provided at one end of the resonant cavity; and at least one injector configured to inject propellant into the resonant cavity so as to create a rotating circumferential flow; wherein the standing wave field raises a temperature of the injected propellant to provide thrust by way of a hot gas exiting the resonant cavity via the nozzle.

Aspect 2. The thruster system of aspect 1, further comprising: an annular structure extending into the resonant cavity to support the at least one injector, wherein the annular structure determines a point along a thrust axis and a radial distance from the thrust axis where the propellant enters the resonant cavity.

Aspect 3. The thruster system of aspect 2, wherein the at least one injector includes a channel within the annular structure, and wherein at least a portion of the channel is not parallel to the thrust axis to inject the propellant into the resonant cavity at an angle relative to the thrust axis.

Aspect 4. The thruster system of aspect 2, wherein the at least one injector includes a capillary configured to deliver the propellant into the resonant cavity.

Aspect 5. The thruster system of aspect 2, wherein the annular structure is made of a dielectric material.

Aspect 6. The thruster system of aspect 2, wherein the annular structure surrounds the nozzle.

Aspect 7. The thruster system of any of any of the preceding aspects, comprising a plurality of injectors equally spaced apart along a circumference around the nozzle.

Aspect 8. The thruster system of any of any of the preceding aspects, wherein the resonant cavity is cylindrical.

Aspect 9. The thruster system of aspect 8, wherein the annular structure has a varying inner diameter that decreases along a direction of the thrust, for at least a portion of a height of the annular structure measured along the thrust axis.

Aspect 10. A method in a spacecraft for operating a thruster that includes a microwave source, a resonant cavity, and a source of propellant which the thruster uses to generate thrust, the method comprising: injecting a propellant into the resonant cavity, including imparting angular momentum to the injected propellant; and causing the microwave source to generate a standing wave within the resonant cavity to raise a temperature of the injected propellant and provide thrust by way of a hot gas exiting the resonant cavity via the nozzle, wherein the angular momentum imparted to the injected propellant produces a rotating circumferential flow of the hot gas within the resonant cavity.

Aspect 11. The method of aspect 10, wherein imparting the angular momentum to the injected propellant includes rotating a structure including the resonant cavity relative to a housing of the spacecraft, along a thrust axis.

Aspect 12. The method of aspect 10, wherein imparting the angular momentum to the injected propellant includes injecting the propellant into the resonant cavity at an angle relative to a thrust axis.

Aspect 13. A method in a spacecraft for operating a thruster that includes a microwave source, a resonant cavity, and a source of propellant which the thruster converts to hot gas and directs via a nozzle to generate thrust, the method comprising: operating the thruster in an ignition mode in which the microwave source outputs power at a first rate; and operating the thruster in a propulsion mode in which the microwave source outputs power at a second rate higher than the first rate.

Aspect 14. The method of aspect 13, further comprising: transitioning from the ignition mode to the propulsion mode when at least a portion of the propellant is ionized.

Aspect 15. The method of aspect 13, further comprising: injecting the propellant into the resonant cavity at a first rate while the thruster operates in the ignition mode; and injecting the propellant into the resonant cavity at a second rate higher than the first rate while the thruster operates in the propulsion mode.

Aspect 16. The method of aspect 15, further comprising: ramping up a rate at which the propellant is injected into the resonant cavity from the first rate to the second rate in response to the determining that the at least a portion of the propellant is ionized.

Aspect 17. The method of aspect 16, further comprising: increasing the rate at which the microwave source outputs power, starting prior to ramping up the rate at which the propellant is injected into the resonant cavity.

Aspect 18. A method in a spacecraft for operating a thruster that includes a microwave source, a resonant cavity, and a source of propellant which the thruster uses to generate thrust, the method comprising: injecting the propellant into the resonant cavity at a first flow rate; causing the microwave source to generate power for application to the injected propellant resonant cavity until at least a portion of the propellant is ionized, at a second time subsequent to the first time; and injecting the propellant into the resonant cavity at a second flow rate higher than the first flow rate, subsequently to the second time.

Aspect 19. The method of aspect 18, further comprising: causing the microwave source to generate power at a first rate prior to a time when the at least a portion of the propellant is ionized; and causing the microwave source to generate power at a second rate higher than the first rate when the propellant is injected into the resonant cavity at the second flow rate.

Aspect 20. The method of aspect 19, further comprising: causing the microwave source to start increasing the power prior to ramping up the rate at which the propellant is injected into the resonant cavity from the first rate to the second rate.

Aspect 21. A thruster system comprising: a microwave source; a resonant cavity coupled to the microwave source, wherein the microwave source is configured to generate a standing wave field in the resonant cavity; a nozzle provided at one end of the resonant cavity; at least one injector configured to inject propellant into the resonant cavity; and a controller configured to operate the thruster system according to any of aspects 13-20.

Aspect 22. A thruster comprising: a cavity in which a propellant is heated to generate hot gas; a top plate disposed at one end of the cavity, the top plate made of a first material having a first coefficient of thermal expansion $\alpha_1$; a nozzle embedded in the top plate, the nozzle made of a second material having a second coefficient of thermal expansion $\alpha_2$ different from $\alpha_1$; and an insert disposed between the nozzle and the top plate, the insert made of a third material selected so as to reduce stress on the nozzle due to a difference in thermal expansion of the nozzle and the top plate when the hot gas exits the cavity via the nozzle to generate thrust.

Aspect 23. The thruster of aspect 1, wherein the third material has a third coefficient thermal expansion $\alpha_3$ different from $\alpha_1$ and $\alpha_2$.

Aspect 24. The thruster of aspect 23, wherein $\alpha_3$ is smaller than $\alpha_2$.

Aspect 25. The thruster of aspect 23 or 24, wherein $\alpha_3$ is smaller than $\alpha_1$.

Aspect 26. The thruster of aspect 24, wherein each of the top plate, the nozzle, and the insert has an annular structure of radius $R_1$, $R_2$, and $R_3$, respectively.

Aspect 27. The thruster of aspect 22, wherein the insert is elastic.

Aspect 28. The thruster of aspect 22, wherein the first material is steel.

Aspect 29. The thruster of aspect 22, wherein the second material is a ceramic material.

Aspect 30. The thruster of aspect 22, wherein the nozzle has a ceramic coating.

Aspect 31. The thruster of aspect 22, wherein the cavity is cylindrical.

Aspect 32. The thruster of aspect 22, wherein the cavity is a resonant cavity configured to generate a standing wave field based on an output of a microwave source.

Aspect 33. A thruster system for use in a spacecraft, the thruster system comprising: a microwave source; a resonant cavity coupled to the microwave source, wherein the microwave source is configured to generate a standing wave field in the resonant cavity; an injector configured to inject propellant into the resonant cavity; a nozzle provided at one end of the resonant cavity; and an annular structure extending into the resonant cavity, the annular structure configured to reduce a radius of the resonant cavity near the nozzle to improve vorticity of a hot gas exiting the resonant cavity via the nozzle.

Aspect 34. The thruster system of aspect 33, wherein annular structure is shaped as a frustum with a narrower diameter near the nozzle and a wider diameter farther away from the nozzle, along a thrust axis of the thruster system.

Aspect 35. The thruster system of aspect 33 or 34, wherein the annular structure is made of a dielectric material.

Aspect 36. The thruster system of any of aspects 33-35, wherein the annular structure support the injector and determines a point along a thrust axis and a radial distance from the thrust axis where the propellant enters the resonant cavity.

Aspect 37. The thruster system of any of aspects 33-36, wherein the annular structure surrounds the nozzle.

Aspect 38. A thruster comprising: a cavity in which a hot gas is generated using a propellant; an injector configured to deliver the propellant into the cavity; a top plate disposed at one end of the cavity; and an adapter configured to receive a nozzle and removeably attach to the top plate; wherein the hot gas exits cavity via the nozzle to generate thrust.

Aspect 39. The thruster of aspect 38, wherein the adapter includes a flange to mate with an annular structure of the top plate.

Aspect 40. The thruster of aspect 38 or 39, wherein the top plate is integral with a housing of the resonant cavity.

Aspect 41. The thruster of aspect 38, wherein the cavity is a resonant cavity, the thruster further comprising a microwave source configured to generate a standing wave field in the resonant cavity.

Aspect 42. A thruster system for use in a spacecraft, the thruster system comprising: a microwave source; a cylindrical resonant cavity with a diameter that varies along a direction of the thrust, for at least a portion of a height of the resonant cavity, the resonant cavity coupled to the microwave source which generates a standing wave field in the resonant cavity; a nozzle provided at one end of the resonant cavity; and at least one injector configured to inject propellant into the resonant cavity; wherein the standing wave field raises a temperature of the injected propellant to provide thrust by way of a hot gas exiting the resonant cavity via the nozzle.

Aspect 43. The thruster system of aspect 42, wherein the resonant cavity includes: a first section proximal to the nozzle having a first constant diameter; a second section distal to the nozzle having a second constant diameter greater than the first timer.

Aspect 44. The thruster system of aspect 43, wherein the resonant cavity further a third section in which the diameter varies linearly along the direction of the thrust between the first diameter and the second diameter, the third section disposed between the first section and the second section.

Aspect 45. The thruster system of aspect 42, wherein the resonant cavity includes: a first section proximal to the nozzle in which a diameter increases in proportion with a distance from the nozzle; and a second section distal to the nozzle in which a diameter decreases in proportion with a distance from the nozzle.

Aspect 46. A method for operating a microwave electrothermal thruster (MET) system of a spacecraft, the method comprising: causing a plurality of microwave generators to generate a plurality of respective signals; combining power of at least several of the plurality of generated signals, including: adjusting a phase of each of the plurality of generated signals, and directing the plurality of phase-shifted signals to a switching network; and providing an output of the switching network to at least one resonant cavity of a respective MET thruster.

Aspect 47. The method of aspect 46, wherein further comprising phase-locking the plurality of microwave generators.

Aspect 48. The method of aspect 47, wherein adjusting the phase of each of the plurality of generated signals includes using a phase adjustment network; the method further comprising: tuning the phase adjustment network to cause the plurality of microwave generators to become phase-locked.

Aspect 49. The method of aspect 46, wherein adjusting the phase of each of the plurality of generated signals includes using filters.

Aspect 50. The method of aspect 46, wherein adjusting the phase of each of the plurality of generated signals includes using delay lines.

Aspect 51. The method of aspect 46, wherein the switching network includes a combiner.

Aspect 52. The method of aspect 46, including providing the output of the switching network to a single MET thruster.

Aspect 53. The method of aspect 46, including providing a first portion of the output of the switching network to a first MET thruster, and a second portion of the output of the switching network to a second MET thruster.

Aspect 54. The method of aspect 46, further comprising: providing redundancy to the at least one MET thruster by selectively directing a first signal from a first one of the plurality of microwave generators or a second signal from a second one of the plurality of microwave generators to the at least one MET thruster, in accordance with respective operational statuses of the first and second microwave generators.

Aspect 55. A redundant microwave electrothermal thruster (MET) system of a spacecraft, the system comprising: a plurality of microwave generators to generate a plurality of respective signals; and a switching network configured to receive the plurality of respective signals and direct at least a subset of the plurality of signals to one or more MET thrusters of the spacecraft.

Aspect 56. The MET system of aspect 55, wherein the switching network is configured to selectively direct a first signal from a first one of the plurality of microwave generators or a second signal from a second one of the plurality of microwave generators to a MET thruster included in the one or more MET thrusters, in accordance with respective operational statuses of the first and second MET microwave generators.

Aspect 57. The MET system of aspect 55, wherein the switching network includes a combiner and is configured to (i) combine, using the combiner, a first signal from a first one of the plurality of microwave generators with a second signal from a second one of the plurality of microwave generators to generate a combined output, and (ii) direct the combined signal to a MET thruster included in the one or more MET thrusters.

Aspect 58. The MET system of any of aspects 55-57, further comprising: a plurality of phase adjusters coupled to the plurality of microwave generators and configured to adjust a phase of each of the plurality of signals.

Aspect 59. The MET system of aspect 58, wherein the plurality of phase adjusters includes one or more delay lines.

Aspect 60. The MET system of aspect 58, wherein the plurality of phase adjusters includes one or more filters.

Aspect 61. The MET system of any of aspects 55-60, further comprising: a controller coupled to the switching network, the controller configured to control the switching network to direct the signals generated the plurality of microwave generators to the one or more MET thrusters.

Aspect 62. The MET system of aspect 61, wherein the controller is configured to (i) detect a failure of one of the plurality of microwave generators coupled to a MET thruster included in the one or more MET thrusters, and (ii) in response to detected failure, redirect output of another one of the plurality of microwave generators to the MET thruster, using the switching network.

Aspect 63. The MET system of any of aspects 55-62, wherein the switching network includes one or more mechanical relays.

Aspect 64. The MET system of any of aspects 55-62, wherein the switching network includes one or more solid-state switches.

Aspect 65. A method of manufacturing a thruster of a spacecraft, the thruster including a cavity and a nozzle, the method comprising: operating the thruster in a first operational mode prior to deployment of the thruster in space, including: injecting a coating mix including at least one coating material into the cavity, and causing a first hot gas including the coating mix to exit the cavity via the nozzle, thereby coating a throat of the nozzle with the coating material; wherein the thruster, when operating in space in a second operational mode, receives a propellant to generate a second hot gas and produces thrust by expelling the second hot gas via the nozzle.

Aspect 66. The method of aspect 65, wherein causing the nozzle with the coating material includes depositing oxide ceramics onto the throat of the nozzle.

Aspect 67. The method of aspect 65, wherein coating the nozzle with the coating material includes depositing non-oxide ceramics onto the throat of the nozzle.

Aspect 68. The method of aspect 65, wherein coating the nozzle with the coating material includes depositing oxide ceramics onto the throat of the nozzle.

Aspect 69. The method of aspect 65, wherein coating the nozzle with the coating material includes depositing a refractory metal onto the throat of the nozzle.

Aspect 70. The method of aspect 69, wherein the refractory metal is tungsten.

Aspect 71. The method of aspect 65, wherein coating the nozzle with the coating material includes depositing a diamond film onto the throat of the nozzle.

Aspect 72. The method of aspect 65, wherein coating the nozzle with the coating material includes depositing a sapphire film onto the throat of the nozzle.

Aspect 73. The method of aspect 65, wherein the coating material is a chemical product of a coating agent, and wherein the coating mix includes the coating agent.

Aspect 74. The method of aspect 65, wherein the coating material protects the nozzle from oxidation.

Aspect 75. The method of aspect 65, wherein the coating mix includes silicon and oxygen to produce a silicon dioxide coating of the throat of the nozzle.

Aspect 76. A method of operating a thruster of a spacecraft, the thruster including a cavity and a nozzle, the method comprising: operating the thruster in a first operational mode, including: injecting a coating mix including at least one coating material into the cavity, and causing a first hot gas including the coating mix to exit the cavity via the nozzle, thereby coating a throat of the nozzle with the coating material; and operating the thruster in a second operational mode, including injecting a propellant to generate a second hot gas to produce thrust by expelling the second hot gas via the nozzle.

Aspect 77. The method of aspect 76, wherein: operating the thruster in the first operational mode includes generating a first amount of thrust; and operating the thruster in the second operational mode includes generating a second amount of thrust greater than the first amount of thrust.

Aspect 78. The method of aspect 76, wherein causing the nozzle with the coating material includes depositing oxide ceramics onto the throat of the nozzle.

Aspect 79. The method of aspect 76, wherein coating the nozzle with the coating material includes depositing non-oxide ceramics onto the throat of the nozzle.

Aspect 80. The method of aspect 76, wherein coating the nozzle with the coating material includes depositing a refractory metal onto the throat of the nozzle.

Aspect 81. The method of aspect 80, wherein the refractory metal is tungsten.

Aspect 82. The method of aspect 76, wherein coating the nozzle with the coating material includes depositing a diamond film onto the throat of the nozzle.

Aspect 83. The method of aspect 76, wherein coating the nozzle with the coating material includes depositing a sapphire film onto the throat of the nozzle.

Aspect 84. The method of aspect 76, wherein the coating material is a chemical product of a coating agent, and wherein the coating mix includes the coating agent.

Aspect 85. The method of aspect 76, wherein the coating material protects the nozzle from oxidation.

Aspect 86. The method of aspect 76, wherein the coating mix includes silicon and oxygen to produce a silicon dioxide coating of the throat of the nozzle.

Aspect 87. The method of aspect 76, including: injecting the coating mix into the cavity via a first injector, and injecting the propellant into the cavity via a second injector.

Aspect 88. The method of aspect 76, including controlling a flow rate through each of the first injector and the second injector via a respective valve.

Aspect 89. A thruster system for use in a spacecraft, the thruster system comprising: a microwave source; a cylindrical housing of a resonant cavity; a waveguide to couple the microwave source to the resonant cavity, the waveguide shaped so as to abut the cylindrical housing along at least a portion of a circumference of the cylindrical housing, to increase coupling efficiency.

Aspect 90. The thruster system of aspect 89, wherein the waveguide has a rectangular cross-section.

Aspect 91. The thruster system of aspect 89 or 90, wherein the waveguide includes an aperture in a section that abuts the cylindrical housing, to couple an electromagnetic field generated by the microwave source into the resonant cavity.

Aspect 92. The thruster system of aspect 89 or 90, wherein the waveguide includes a plurality of apertures in a section that abuts the cylindrical housing, each of the plurality of apertures configured to couple an electromagnetic field generated by the microwave source into the resonant cavity.

Aspect 93. The thruster system of aspects 91 or 92, wherein each aperture has a longer dimension parallel to an axis of the cylindrical housing and a shorter dimension.

Aspect 94. A thruster system for use in a spacecraft, the thruster system comprising: a microwave source configured to generate an electromagnetic signal; a resonant cavity coupled to the microwave source, wherein the microwave source is configured to generate a standing wave field in the resonant cavity; a ferrite insert disposed within the resonant cavity; a magnet disposed outside the resonant cavity and configured to exert a magnetic bias field on the ferrite insert to thereby modify electromagnetic properties of the ferrite insert and tune the resonant frequency of the resonant cavity.

Aspect 95. The thruster system of aspect 94, wherein the magnet is an electromagnet controlled by a controller.

Aspect 96. The thruster system of aspect 95, wherein the controller is configured to: not activate the electromagnet prior to determining that at least a portion of a propellant is ionized in the resonant cavity; and activate the electromagnet in response to determining that at least a portion of a propellant is ionized in the resonant cavity.

Aspect 97. The thruster system of aspect 94, wherein: the resonant cavity is disposed in a cylindrical housing; a nozzle of the thruster is disposed at a first end of the cylindrical housing, and the magnet is placed outside a second end of the cylindrical housing.

Aspect 98. The thruster system of aspect 94, wherein: the resonant cavity is disposed in a cylindrical housing; and the magnet is placed outside a vertical wall of the cylindrical housing.

Aspect 99. A method in a spacecraft for operating a thruster that includes a microwave source, a resonant cavity, and a source of propellant which the thruster converts to hot gas and directs via a nozzle to generate thrust, the method comprising: operating the thruster in an ignition mode in which the propellant is not ionized; and operating the thruster in a propulsion mode in which at least a portion of the propellant is ionized to generate plasma, including automatically tuning the resonant cavity to counteract an impact of the generated plasma on resonant frequencies of the resonant cavity.

Aspect 100. The method of aspect 99, wherein tuning the resonant cavity includes activating a magnet disposed outside a housing of the resonant cavity, the magnet exerting a magnetic bias field on a ferrite insert disposed inside the resonant cavity.

Aspect 101. The method of aspect 99, wherein the magnet is an electromagnet, the method including controlling the electromagnet using a controller.

Aspect 102. A thruster comprising: a cavity in which a propellant is heated to generate hot gas; a top plate disposed at one end of the cavity; a nozzle embedded in the top plate; and a nozzle insert made of a refractory metal and configured to fit inside a throat of the nozzle to reduce oxidation of the nozzle.

Aspect 103. The thruster of aspect 102, wherein the refractory metal includes iridium.

Aspect 104. The thruster of aspect 102, wherein the refractory metal includes niobium.

Aspect 105. The thruster of aspect 102, wherein the refractory metal includes a plurality of layers of different metals.

Aspect 106. A method of operating a thruster of a spacecraft, the thruster including a cavity and a nozzle, the method comprising: providing a propellant to the cavity via a propellant supply line; injecting a coating mix including at least one coating material into the propellant supply line, so that a mixture of the propellant and the coating mix is injected into the cavity; and operating the thruster to generate a hot gas inside the cavity and produce thrust by expelling the hot gas from the cavity via the nozzle, including causing the hot gas to coat a throat of the nozzle with the coating material to protect the nozzle from oxidation.

Aspect 107. The method of aspect 106, wherein causing the hot gas to coat the throat of the nozzle with the coating material includes depositing at least one of (i) oxide ceramics, (ii) non-oxide ceramics, (iii) a refractory metal, (iv) a diamond film, or (v) a sapphire film onto the nozzle.

Aspect 108. The method of aspect 106, including controlling a rate of injecting the coating mix into the propellant supply using a first valve, and controlling a rate of providing the propellant to the cavity using a second valve.

Aspect 109. A multi-mode thruster system for use in a spacecraft, the thruster system comprising: a microwave source; a cavity coupled to the microwave source and including a first inlet to receive a first fluid and a second inlet to receive a second fluid; and a nozzle provided at one end of the cavity; wherein: the thruster operates in a microwave electrothermal thruster (MET) mode to (i) generate a standing wave in the cavity using the microwave source and (ii) raise a temperature of the first fluid to generate a first hot gas that exits the cavity via the nozzle to generate thrust; and the thruster operates in a chemical propulsion mode to (i) produce a reduction-oxidation reaction between the first fluid and the second fluid and (ii) generate a second hot gas that exits the cavity via the nozzle to generate thrust.

Aspect 110. The multi-mode thruster system of aspect 109, wherein the cavity receives at least one of (i) water, (ii) hydrozene, (iii) hydrogen peroxide, or (iii) ammonia as the first fluid via the first inlet when the thruster operates in the MET mode.

Aspect 111. The multi-mode thruster system of aspect 109 or 110, wherein the cavity operates as a resonant cavity when the thruster operates in the MET mode.

Aspect 112. The multi-mode thruster system of any of aspects 109-111, wherein the cavity receives an oxidation agent via the first inlet and a reducing agent via the second inlet when operating in the chemical propulsion mode.

Aspect 113. The multi-mode thruster system of aspect 109, wherein the first inlet receives a same fluid in the MET mode and the chemical propulsion mode, and wherein the fluid operates as propellant in the MET mode and as an oxidation agent in the chemical propulsion mode.

Aspect 114. The multi-mode thruster system of aspect 113, wherein the first fluid includes hydrogen peroxide.

Aspect 115. The multi-mode thruster system of any of aspects 109-114, further comprising a controller configured to: activate the MET mode in response to determining that the spacecraft requires a first amount of thrust; and activate the chemical propulsion mode in response to determining that the spacecraft requires a second amount of thrust larger than the first amount of thrust.

Aspect 116. The multi-mode thruster system aspect 109, wherein: in the MET mode, the first fluid is water; and in the chemical propulsion mode, the first fluid is oxygen and the second fluid is hydrogen.

Aspect 117. The multi-mode thruster system of aspect 116, further comprising: a propellant tank configured to store water; and a fuel cell configured separately store oxygen and hydrogen.

Aspect 118. A thruster system for use in a spacecraft, the thruster system comprising: a microwave source configured to generate microwave energy; a waveguide coupled the microwave source; a propellant compartment fluidicly coupled to a propellant supply line to receive a propellant; and a nozzle disposed at one end of the propellant compartment; wherein the propellant compartment is disposed through the wave guide, so that the waveguide delivers the microwave energy to the propellant within the propellant compartment to heat up the propellant and generate thrust in a form of hot gas existing the propellant compartment via the nozzle.

Aspect 119. The thruster system of aspect 118, wherein the propellant compartment does not operate as a resonant cavity.

Aspect 120. The thruster system of aspect 118, wherein a portion of the waveguide through the propellant compartment is disposed forms a rectangular resonant cavity.

Aspect 121. A thruster system for use in a spacecraft, the thruster system comprising: a microwave source configured to generate microwave energy; a coaxial transmission line coupled the microwave source; a propellant compartment disposed within the coaxial transmission line; and a nozzle disposed at one end of the coaxial transmission line; wherein the waveguide delivers the microwave energy to the propellant within the propellant compartment to heat up the propellant and generate thrust in a form of hot gas existing the propellant compartment via the nozzle.

Aspect 122. The thruster system of aspect 121, wherein a section of the coaxial transmission line proximate to the nozzle forms a resonant cavity.

Aspect 123. The thruster system of aspect 121, wherein a section of the coaxial transmission line is a quarter-wavelength impedance transformer.

Aspect 124. The thruster system of aspect 121, wherein the coaxial transmission line includes a dielectric window to separate a first portion of the coaxial transmission line from a second portion of the coaxial transmission line in which the hot gas is contained.

Aspect 125. The thruster system of aspect 121, wherein the propellant compartment is disposed between a center conductor and a shield of the coaxial transmission line.

What is claimed:

1. A thruster system for use in a spacecraft, the thruster system comprising:
    a microwave source;
    a structure configured to rotate relative to a housing of the spacecraft and including a resonant cavity coupled to the microwave source, wherein the microwave source is configured to generate a standing wave field in the resonant cavity;
    a nozzle provided at one end of the resonant cavity; and
    at least one injector configured to inject propellant into the resonant cavity, wherein rotating the structure imparts angular momentum to the injected propellant and creates a rotating circumferential flow;
    wherein the standing wave field heats the injected propellant to provide thrust by way of the heated injected propellant exiting the resonant cavity via the nozzle.

2. The thruster system of claim 1, wherein the resonant cavity is cylindrical.

3. The thruster system of claim 1, wherein the structure includes:
    a hollow shaft mechanically connected to a motor and attached to a second end of the cavity opposite to the one end of the resonant cavity with the nozzle.

4. The thruster system of claim 1, further including:
    a support bearing configured to support the one end of the resonant cavity with the nozzle.

5. The thruster system of claim 1, further including:
    a cap configured to cover the one end of the resonant cavity with the nozzle to prevent the propellant from leaking out of the resonant cavity in one mode of operation, and to uncover the one end of the resonant cavity with the nozzle in another mode of operation.

6. The thruster system of claim 1, further including:
    two electrodes disposed within the resonant cavity; and
    a source of voltage configured to create an arc between the two electrodes by ionizing the injected propellant.

7. The thruster system of claim 6, wherein one of the two electrodes is disposed at the nozzle.

8. The thruster system of claim 1, wherein the structure configured to rotate is a first structure and the thruster system includes:
    a second structure configured to rotate relative to the housing of the spacecraft to thereby generate angular momentum in the direction opposite to angular momentum generated by the first structure.

9. The thruster system of claim 8, wherein:
    the second structure configured to generate angular momentum equal in magnitude to the angular momentum generated by the first structure to thereby minimize a total angular momentum of the first structure and the second structure.

10. The thruster system of claim 8, wherein:
    the second structure configured to generate angular momentum different in magnitude to the angular momentum generated by the first structure to thereby cause the spacecraft to turn.

11. A method in a spacecraft for operating a thruster that includes a microwave source, a resonant cavity, and a source of propellant which the thruster uses to generate thrust, the method comprising:
    injecting a propellant into the resonant cavity, including imparting angular momentum to the injected propellant, wherein imparting the angular momentum to the injected propellant includes rotating a structure including the resonant cavity relative to a housing of the spacecraft, along a thrust axis; and
    causing the microwave source to generate a standing wave within the resonant cavity to heat the injected propellant and provide thrust by way of the heated injected propellant exiting the resonant cavity via a nozzle, wherein the angular momentum imparted to the injected propellant produces a rotating circumferential flow of the injected propellant within the resonant cavity.

12. The method of claim 11, wherein imparting the angular momentum to the injected propellant includes injecting the propellant into the resonant cavity at an angle relative to a thrust axis.

13. The method of claim 11, further including:
    covering the nozzle with a cap to prevent the propellant from leaking out of the resonant cavity in one mode of operation, and uncovering the nozzle in another mode of operation.

14. The method of claim 11, wherein rotating the structure includes:
    rotating a hollow shaft mechanically connected to a motor and attached to a first end of the resonant cavity.

15. The method of claim 14, further including:
    supporting a second end of the resonant cavity with a support bearing.

16. The method of claim 11, further including:
    generating an arc between two electrodes disposed within the resonant cavity using a source of voltage to ionize the injected propellant.

17. The method of claim 16, wherein:
    at least one of the two electrodes is disposed at the nozzle.

18. The method of claim 11, wherein the structure configured to rotate is a first structure and the method includes:
    rotating a second structure relative to the housing of the spacecraft to thereby generate angular momentum in the direction opposite to angular momentum generated by rotating the first structure.

19. The method of claim 18, wherein:
    rotating the second structure generates angular momentum equal in magnitude to the angular momentum generated by the first structure to thereby minimize a total angular momentum of the first structure and the second structure.

20. The method of claim 18, wherein:
rotating the second structure generates angular momentum different in magnitude to the angular momentum generated by the first structure to thereby cause the spacecraft to turn.

* * * * *